(12) United States Patent
Fukasaku

(10) Patent No.: US 11,804,554 B2
(45) Date of Patent: *Oct. 31, 2023

(54) DIODE

(71) Applicant: SONY SEMICONDUCTOR SOLUTIONS CORPORATION, Kanagawa (JP)

(72) Inventor: Katsuhiko Fukasaku, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/829,749

(22) Filed: Jun. 1, 2022

(65) Prior Publication Data

US 2022/0302322 A1 Sep. 22, 2022

Related U.S. Application Data

(63) Continuation of application No. 17/268,323, filed as application No. PCT/JP2019/031920 on Aug. 14, 2019, now Pat. No. 11,393,931.

(30) Foreign Application Priority Data

Sep. 5, 2018 (JP) ................................. 2018-165856

(51) Int. Cl.
*H01L 29/06* (2006.01)
*H01L 29/868* (2006.01)
(Continued)

(52) U.S. Cl.
CPC ........ *H01L 29/868* (2013.01); *H01L 29/0673* (2013.01); *H01L 29/165* (2013.01); *H01L 29/36* (2013.01); *H01L 29/45* (2013.01)

(58) Field of Classification Search
CPC ... H01L 29/0673; H01L 29/165; H01L 29/36; H01L 29/45; H01L 29/868
(Continued)

(56) References Cited

U.S. PATENT DOCUMENTS 9,842,835 B1  12/2017  Cheng et al.
10,411,090 B2  9/2019  Weber et al.
(Continued)

FOREIGN PATENT DOCUMENTS

JP        2012-244088        12/2012

OTHER PUBLICATIONS

Chen et al., "ESD diodes in a bulk Si gate-all-around vertically stacked horizontal nanowire technology," 2016 IEEE International Electron Devices Meeting (IEDM), Dec. 3-7, 2016, pp. 890-893. Abstract only.

(Continued)

*Primary Examiner* — Monica D Harrison
(74) *Attorney, Agent, or Firm* — Sheridan Ross PC

(57) ABSTRACT

A diode of the present disclosure includes a stacked structure, and a first connection section and a second connection section provided at respective ends of the stacked structure in a length direction. The stacked structure includes a first structure and a second structure each having a nanowire structure or a nanosheet structure and stacked alternately in a thickness direction. The first connection section has a first conductivity type, and the second connection section has a second conductivity type. The diode further includes a control electrode section formed to extend at least from a top portion to a side surface of the stacked structure and spaced apart from the first connection section and the second connection section. The first connection section and the control electrode section or the second connection section and the control electrode section are connected electrically.

20 Claims, 25 Drawing Sheets

(51) Int. Cl.
  *H01L 29/165* (2006.01)
  *H01L 29/36* (2006.01)
  *H01L 29/45* (2006.01)
(58) Field of Classification Search
  USPC .......................................................... 257/656
  See application file for complete search history.

(56) References Cited

U.S. PATENT DOCUMENTS

| 11,393,931 | B2* | 7/2022 | Fukasaku | H01L 29/66439 |
| 2019/0393351 | A1 | 12/2019 | Beattie et al. | |
| 2021/0167224 | A1 | 6/2021 | Fukasaku | |

OTHER PUBLICATIONS

International Search Report and Written Opinion for International (PCT) Patent Application No. PCT/JP2019/031920, dated Nov. 19, 2019, 7 pages.

Notice of Allowance for U.S. Appl. No. 17/268,323, dated Mar. 9, 2022, 10 pages.

\* cited by examiner $V=0$ $V>V_{bi}$

DIODE

CROSS REFERENCE TO RELATED APPLICATIONS

This application is a continuation application of U.S. patent application Ser. No. 17/268,323, filed Feb. 12, 2021, which is a national stage application under 35 U.S.C. 371 and claims the benefit of PCT Application No. PCT/JP2019/031920, having an international filing date of 14 Aug. 2019, which designated the United States, which PCT application claimed the benefit of Japanese Patent Application No. 2018-165856, filed 5 Sep. 2018, the entire disclosures of each of which are incorporated herein by reference.

TECHNICAL FIELD

The present disclosure relates to a diode.

BACKGROUND ART

In advanced CMOS technologies, devices are miniaturized increasingly in order to reduce the area and power consumption of each of the devices, and the thickness and channel length of a gate insulating film are reduced. Incidentally, with a reduced channel length, a potential difference between a source region and a drain region affects transistor operations more significantly than a voltage applied by a gate electrode, disadvantageously leading to a degraded short channel characteristic. Thus, for measures against DIBL (Drain Induced Barrier Lowering), which refers to a decrease in the potential of a channel section induced by the drain region, a structure has been under study that can effectively apply a voltage from the gate electrode to the channel section. In known transistors, the gate electrode is formed above the channel section, and a gate voltage is applied only from above the channel section. In contrast, a GAA (Gate All Around) structure has been under study in which the gate electrode is formed via a gate insulating film to surround an upper portion, a side surface, and a lower portion of the channel section. The GAA structure is used to deplete the channel section to allow suppression of the effect of DIBL and degradation of the short channel characteristic. In a transistor with the GAA structure, plural channel sections each with a nanowire structure or a nanosheet structure is provided in juxtaposition in the vertical direction, and outer peripheral portions of the channel sections are embedded in the gate electrode via the gate insulating film.

A semiconductor apparatus includes, as elements achieving circuit functions, transistors (field effect transistors) or diodes corresponding to active elements with an amplifying and rectifying function. For example, a diode with a structure similar to the GAA structure (hereinafter referred to as a "GAA similar structure" for convenience) is proposed in NPL 1, "ESD Diodes in a Bulk Si Gate-All-Around Vertically Stacked Horizontal Nanowire Technology," S.-H. Chen, et al, International Electron Device Meeting Technical Digest, Year: 2016, pp. 890. In the diode with the GAA similar structure, a current path includes a plurality of nanowire structures, and a control electrode section is provided around outer peripheral portions of the nanowire structures.

CITATION LIST

Non Patent Literature

NPL 1

"ESD Diodes in a Bulk Si Gate-All-Around Vertically Stacked Horizontal Nanowire Technology," S.-H. Chen, et al, International Electron Device Meeting Technical Digest, Year: 2016, p. 890

SUMMARY

Technical Problems

The field effect transistor with the GAA structure can operate at low voltage while achieving the short channel characteristic. On the other hand, in the diode with the GAA similar structure, current characteristics required for the diode are sacrificed. Specifically, in the field effect transistor with the GAA structure, the thickness of the channel section is reduced down to 10 nm or less to completely deplete the channel section. Application of such a GAA structure to the diode limits the current path in the diode to 10 nm or less. In a known diode built in a semiconductor substrate (referred to as a "diode with a known structure"), the current path can be formed in the semiconductor substrate down to a depth of approximately 100 nm. Thus, in the diode with the GAA similar structure, the current path has a cross-sectional area approximately one tenth of the cross-sectional area of the diode with the known structure, leading to a reduced current flowing through the diode with the GAA similar structure. Additionally, in a case where the field effect transistor with the GAA structure and the diode with the known structure are manufactured in separate steps, the number of manufacturing steps increases, resulting in increased manufacturing costs.

Thus, an object of the present disclosure is to provide a diode that can maximally suppress a decrease in current that can be passed, the diode having a high affinity for manufacturing steps for field effect transistors.

Solution to Problems

A diode according to a first mode and a second mode of the present disclosure for achieving the object described above includes:

a stacked structure;

a first connection section provided at one end of the stacked structure in a length direction; and a second connection section provided at the other end of the stacked structure in the length direction, in which the stacked structure includes a first structure with a nanowire structure or a nanosheet structure and a second structure with the nanowire structure or the nanosheet structure including a material different from a material constituting the first structure, the first structure and the second structure being stacked alternately in a thickness direction, the first connection section has a first conductivity type, and the second connection section has a second conductivity type different from the first conductivity type.

The diode according to the first mode of the present disclosure further includes a control electrode section formed to extend at least from a top portion to a side surface of the stacked structure and spaced apart from the first connection section and the second connection section, and the first connection section and the control electrode section or the second connection section and the control electrode section are connected electrically. Additionally, in a diode according to a second mode of the present disclosure, a first portion of the stacked structure in contact with the first connection section has the first conductivity type, and a second portion of the stacked structure in contact with the second connection section has the second conductivity type.

DESCRIPTION OF EMBODIMENTS

Figure 1A:
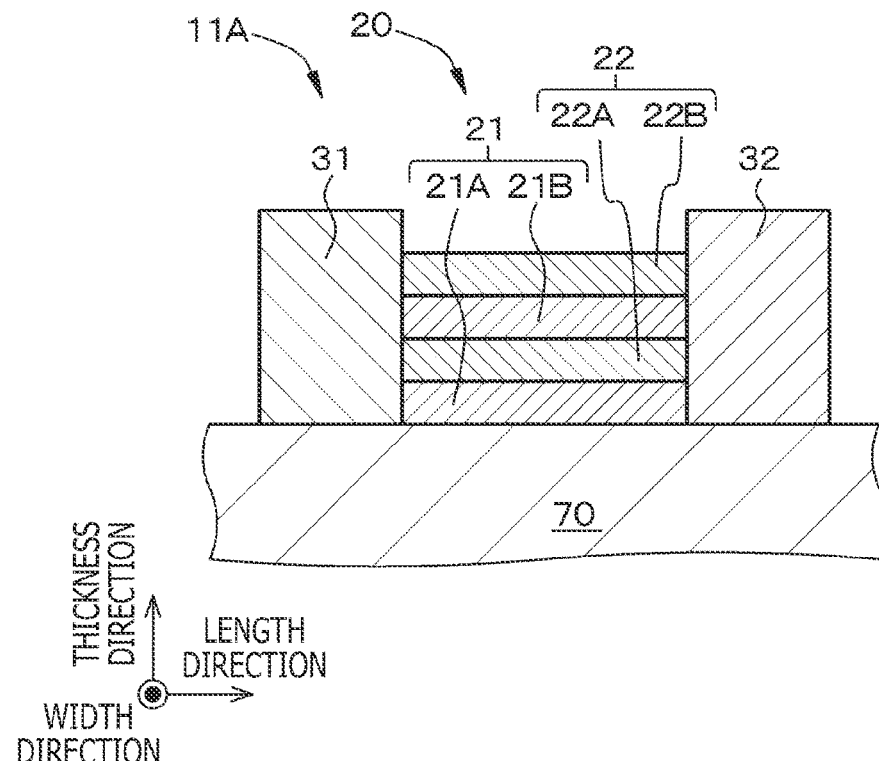
FIGS. 1A and 1B are schematic, partially cross-sectional views of a diode of Example 1 taken along arrows A-A and arrows B-B in FIG. 2A.

With reference to the drawings, the present disclosure will be described on the basis of examples. However, the present disclosure is not limited to the examples, and various numerical values and materials in the examples are illustrative. Note that the description will be in the following order.

1. Description of Diodes according to First and Second Modes of Present Disclosure in General
2. Example 1 (Diode according to First Mode of Present Disclosure)
3. Example 2 (Diode according to Second Mode of Present Disclosure)
4. Others <Description of Diodes According to First and Second Modes of Present Disclosure in General>

Diodes according to first and second modes of the present disclosure can be configured such that a stacked structure is provided on a base. In such a configuration, a bottom surface of the stacked structure is in contact with the base, and thus a control electrode section is not formed on the bottom surface of the stacked structure.

Alternatively, the diodes according to the first and second modes of the present disclosure can be configured such that the control electrode section is formed to reach the bottom surface of the stacked structure, and in this case, the stacked structure is provided above the base. In such a configuration, the bottom surface of the stacked structure is not in contact with the base, and a bottom surface of the control electrode section is in contact with the base. Alternatively, the bottom surface of the control electrode section is located above the base, and a gap is present between the bottom surface of the control electrode section and a top surface of the base.

Further, various above-described preferred configurations of the diodes according to the first and second modes of the present disclosure may be such that the base includes a silicon semiconductor substrate or an SOI (Si On Insulator) substrate or includes a GOI (Ge On Insulator) substrate or an SGOI (SiGe On Insulator) substrate.

Further, various above-described preferred configurations of the diodes according to the first and second modes of the present disclosure may be such that a first connection section and a second connection section are provided on the base.

Further, various above-described preferred configurations of the diode according to the first mode of the present disclosure may be such that a region of the base on which the diode is provided has a second conductivity type, and the first connection section and the control electrode section are connected electrically.

Further, the diodes according to the first and second modes of the present disclosure including various above-described preferred configurations can be configured such that a first conductivity type is a p type, and the second conductivity type is an n type.

Further, the diodes according to the first and second modes of the present disclosure including the above-described preferred forms and configurations can be configured such that a first structure includes silicon-germanium (Si—Ge), and a second structure includes silicon (Si). Alternatively, the configuration may be such that the first structure includes germanium (Ge) or InGaAs and such that the second structure includes silicon (Si).

It is sufficient that the first connection section includes a material constituting the first structure, and the second connection section includes a material constituting the second structure.

Further, the diode according to the first mode of the present disclosure including the above-described preferred forms and configurations can be configured such that the stacked structure includes an intrinsic semiconductor region (intrinsic region) or such that the stacked structure has an impurity concentration of $1\times10^{18}/cm^3$ or less.

Further, the diode according to the first mode of the present disclosure including the above-described preferred forms and configurations can be configured such that an insulating layer (sidewall) is formed on a side surface of the control electrode section facing the first connection section and a side surface of the control electrode section facing the second connection section.

Further, the diode according to the first mode of the present disclosure including the above-described preferred forms and configurations can be configured such that the control electrode section includes TiN, TaN, Al, TiAl, or W.

Additionally, the diode according to the second mode of the present disclosure including the above-described preferred forms can be configured such that a first portion of the stacked structure is in contact with a second portion of the stacked structure.

In the diodes according to the first and second modes of the present disclosure including the above-described preferred forms and configurations, the number of stacked structures may be one or a plural number of two or more. Additionally, the number of first structures may be one or a plural number of two or more, and the number of second structures may be one or a plural number of two or more. The number of the first structures may be the same as or different from the number of the second structures. A lowermost layer of the stacked structure may include the first structure or the second structure. In the diode according to the first mode of the present disclosure, in a case where the number of the stacked structures is a plural number of two or more, one control electrode section may be provided for all of the stacked structures or for each of the stacked structures.

A semiconductor apparatus may include the diode according to the first or second mode of the present disclosure and a field effect transistor including a GAA structure. Here, the field effect transistor includes a channel structure section including plural channel sections each with a nanowire structure or a nanosheet structure, gate insulating films each surrounding a corresponding one of the channel sections, and gate electrodes each surrounding at least a part of a corresponding one of the gate insulating films. At least two channel sections are disposed in juxtaposition in a thickness direction of the channel structure section, and a lowermost layer channel section is formed on or above the base. Specifically, the plural channel sections are spaced apparat from one another in a thickness direction of the channel structure section, and the gate insulating film and the gate electrode are embedded between the channel sections. It is sufficient if the number of channel sections in a stacking direction of the channel structure section of the field effect transistor is two or more, and the number of channel sections in a direction (width direction of the channel structure section) orthogonal to the thickness direction of the channel structure section is one or two or more. A total of heights of the channel sections is a total of diameters or thicknesses of materials (for example, Si or Si—Ge, Ge, or InGaAs) constituting the nanowire structures or nanosheet structures constituting the channel sections.

The configuration may be such that at least a part of the lowermost layer channel section constituting the field effect transistor is surrounded by the gate electrode, and the other channel sections are surrounded by the gate electrode. Specifically, in the field effect transistor, the gate insulating film surrounding the channel section located below the gate insulating film (that is, the gate insulating film formed around an outer peripheral portion of the channel section) and the gate insulating film surrounding the channel section located above the gate insulating film are formed between the channel sections (that is, the gate insulating film formed around an outer peripheral portion of the channel section), and the gate electrode is further formed between the gate insulating films.

The configuration may be such that the channel section of an n-channel field effect transistor includes silicon (Si) and such that the channel section of a p-channel field effect transistor includes silicon-germanium (Si—Ge), germanium (Ge), or InGaAs. However, no such limitation is intended, and

[a] the configuration may be such that the channel section of the n-channel field effect transistor includes silicon-germanium (Si—Ge) and such that the channel section of the p-channel field effect transistor includes silicon (Si), germanium (Ge), or InGaAs,

[b] the configuration may be such that the channel section of the n-channel field effect transistor includes germanium (Ge) and such that the channel section of the p-channel field effect transistor includes silicon (Si), silicon-germanium (Si—Ge), or InGaAs, or

[c] the configuration may be such that the channel section of the n-channel field effect transistor includes InGaAs and such that the channel section of the p-channel field effect transistor includes silicon (Si), silicon-germanium (Si—Ge), or germanium (Ge).

Whether the field effect transistor is of the n-channel type or the p-channel type is determined by the value of a work function for a material constituting the gate electrode, for example. Specifically, in a case where the channel section includes Si, examples of the material constituting the gate electrode to provide an n-channel field effect transistor include TiN, TaN, Al, TiAl, and W. On the other hand, in a case where the channel section includes Si—Ge, examples of the material constituting the gate electrode to provide a p-channel field effect transistor include TiN and W.

The configuration may be such that a voltage applied to the gate electrode of the field effect transistor ranges, for example, from 0.5 to 0.8 V, but no such limitation is intended.

Examples of a material constituting the insulating layer and the gate insulating film may include SiON and SiO$_2$, and a high-dielectric material (what is called a High-k material) for the insulating layer and the gate insulating film may be, for example, HfO$_2$, HfAlON, or Y$_2$O$_3$.

For the nanowire structure constituting the stacked structure, the nanowire structure having a diameter of, for example, 5 to 10 nm and including, for example, Si, Si—Ge, or the like is in contact with the first connection section and the second connection section at the respective ends of the nanowire structure. In the nanosheet structure constituting the stacked structure, a material having a generally rectangular cross-sectional shape, having a width×thickness of, for example, (10 to 50 nm)×(5 to 10 nm), and including, for example, Si, Si—Ge, or the like is in contact with the first connection section and the second connection section at the respective ends of the material. For the nanowire structure constituting the channel section of the field effect transistor, the nanowire structure having a diameter of, for example, 5 to 10 nm and including, for example, Si, Si—Ge, or the like is supported at both ends of the nanowire structure by a source/drain region constituting the field effect transistor. In the nanosheet structure constituting the channel section of the field effect transistor, a material having a generally rectangular cross-sectional shape, having a width×thickness of, for example, (10 to 50 nm)×(5 to 10 nm), and including, for example, Si, Si—Ge, or the like is supported at both ends of the nanowire structure by the source/drain region constituting the field effect transistor. Whether to use the nanowire structure or the nanosheet structure depends on the thickness and width of the material constituting the structure.

As described above, examples of the base include a silicon semiconductor substrate, an SOI substrate, a GOI substrate, and an SGOI substrate. The stacked structure and the channel section preferably have crystallinity but may include a polycrystal material or optionally an amorphous material. Examples of a method for forming the stacked structure or the channel section include an epitaxial CVD method, a plasma CVD method, and an atomic layer deposition method (ALD method).

How diodes and field effect transistors are arranged depends on the required specifications of a semiconductor circuit and cannot be categorically defined. For example, digital circuits such as a logic circuit, a SRAM circuit, and a CMOS circuit may include diodes or field effect transistors, and a logic circuit controlling an image capturing apparatus and a drive circuit for image capturing elements (light receiving elements) constituting the image capturing apparatus may include diodes or field effect transistors, and a CPU, a GPU, and the like may include diodes or field effect transistors. However, no such limitation is intended.

Example 1

Figure 1B:
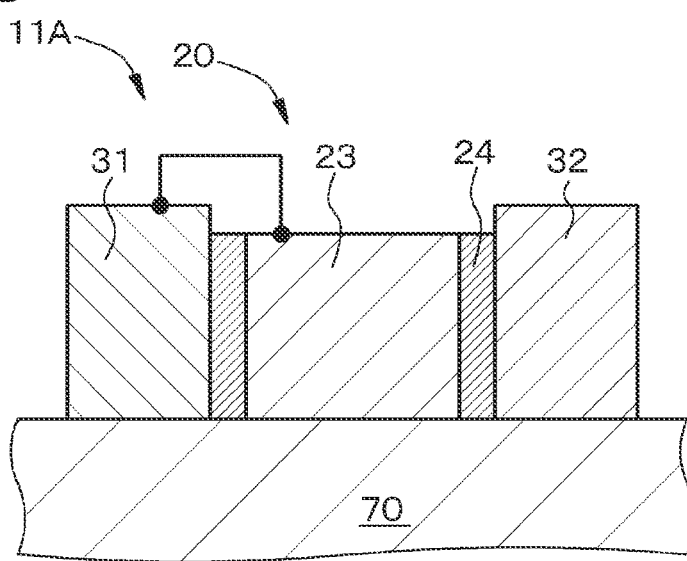
Figure 2A:
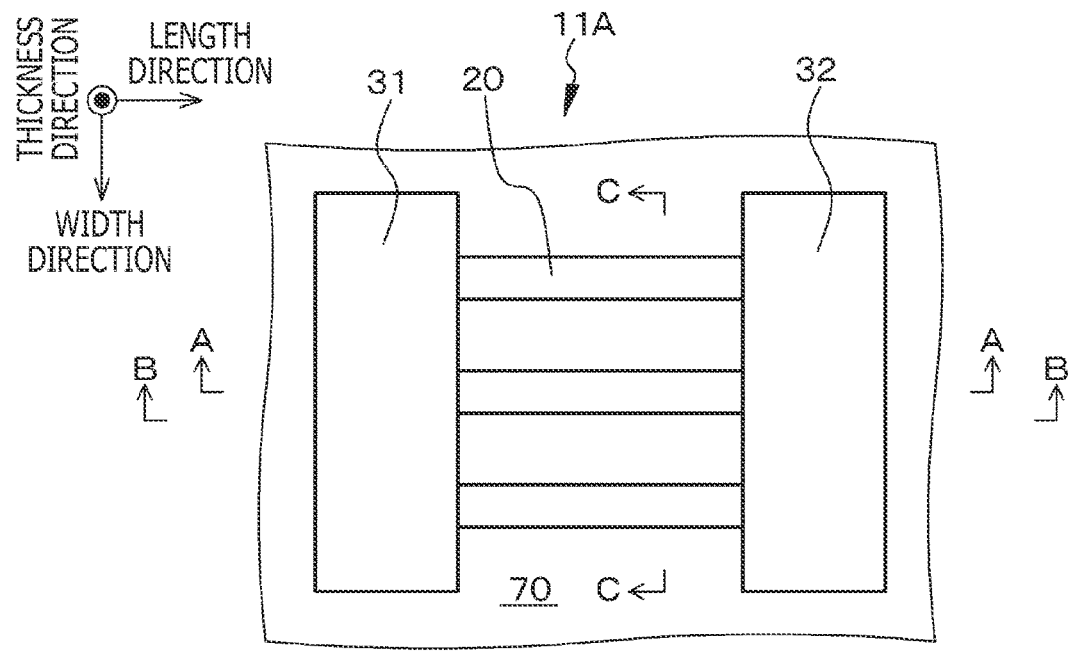
FIGS. 2A and 2B are, respectively, a schematic layout diagram of a stacked structure, a first connection section, and a second connection section of the diode of Example 1 and a schematic layout diagram of a control electrode section, an insulating layer, the first connection section, and the second connection section of the diode of Example 1.
Figure 2B:
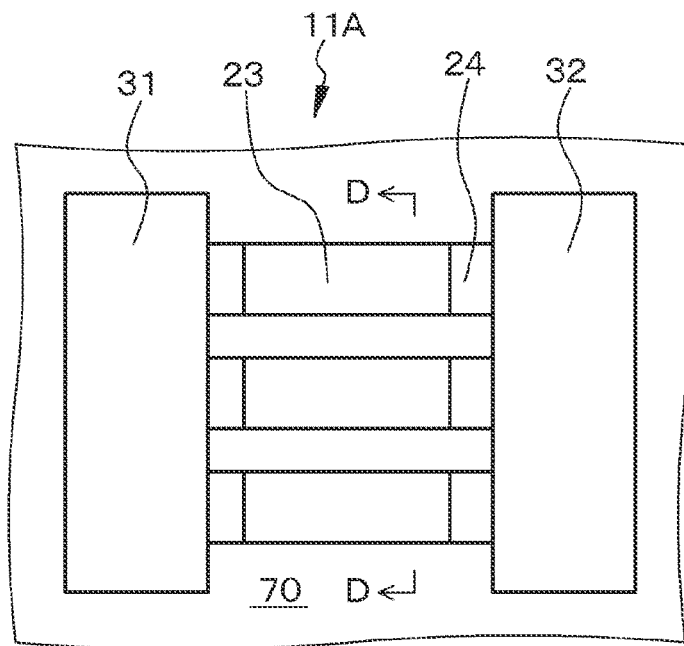
Figure 3A:
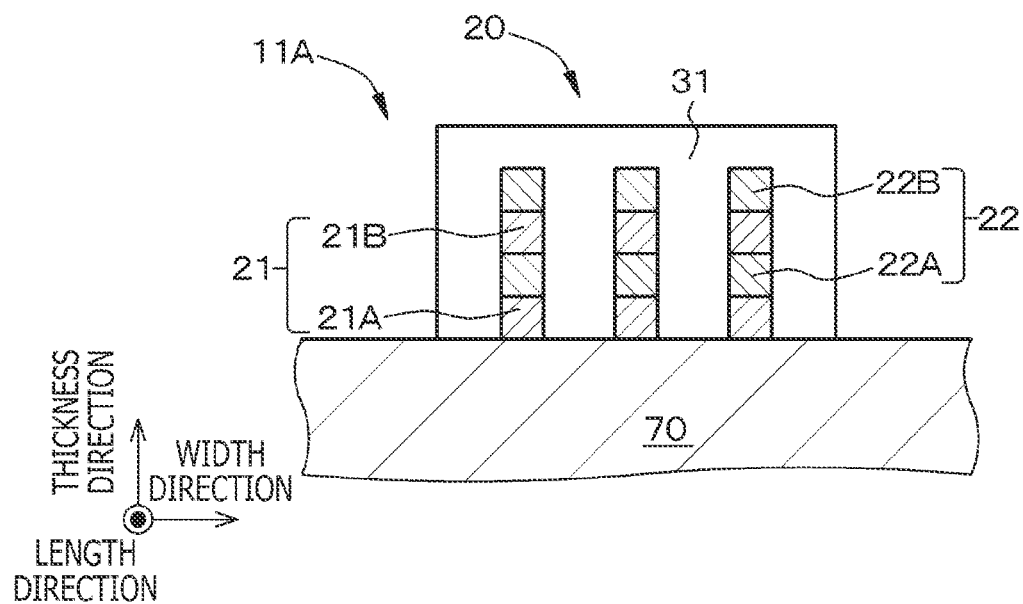
FIG. 3A and FIG. 3B are schematic, partially cross-sectional views of the diode of Example 1 taken respectively along arrows C-C in FIG. 2A and along arrows D-D in FIG. 2B.
Figure 3B:
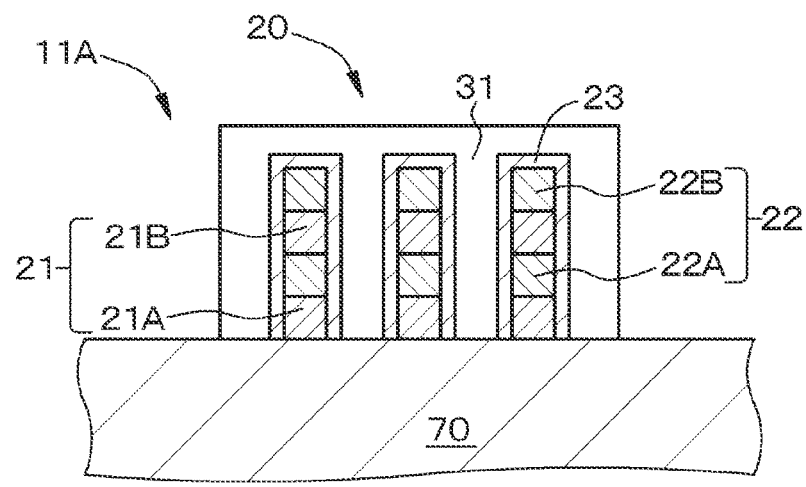
Figure 4A:
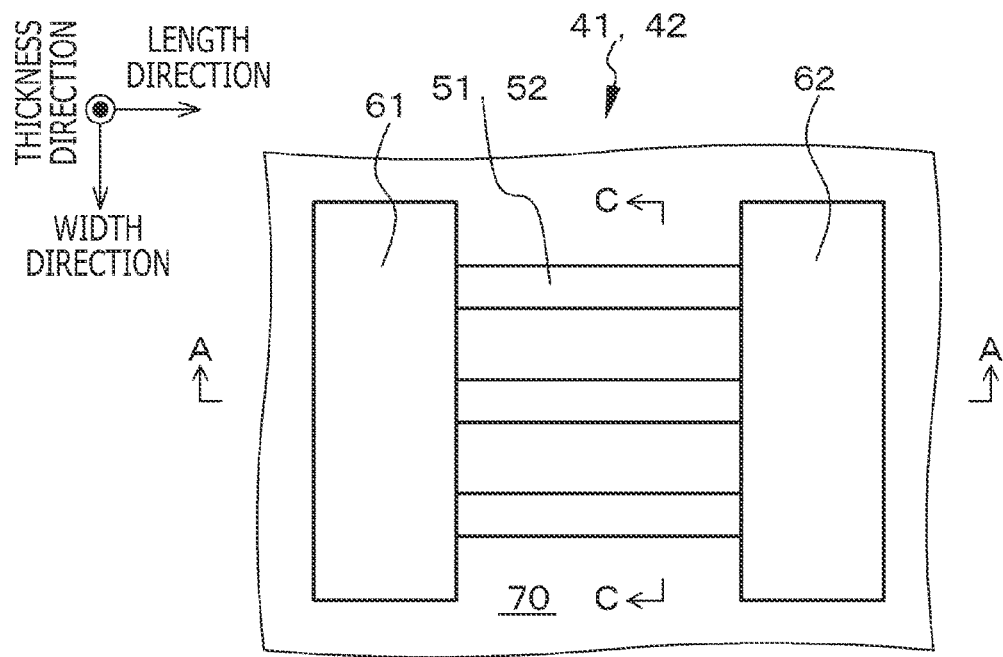
FIG. 4A and FIG. 4B are, respectively, a schematic layout diagram of a channel section and a source/drain region of a field effect transistor in Example 1 and a schematic layout diagram of a gate electrode, a gate sidewall, and the source/drain region of the field effect transistor in Example 1.
Figure 4B:
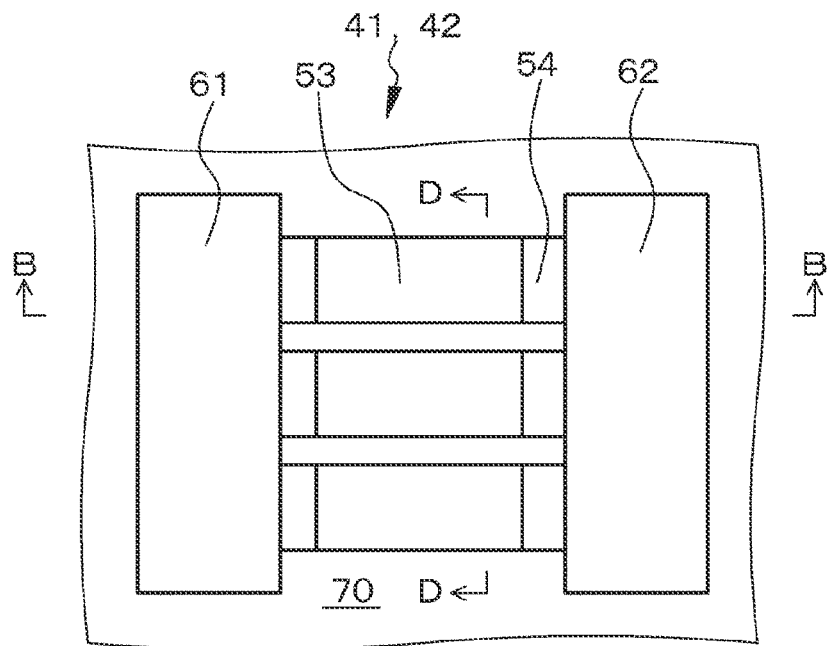
Figure 5A:
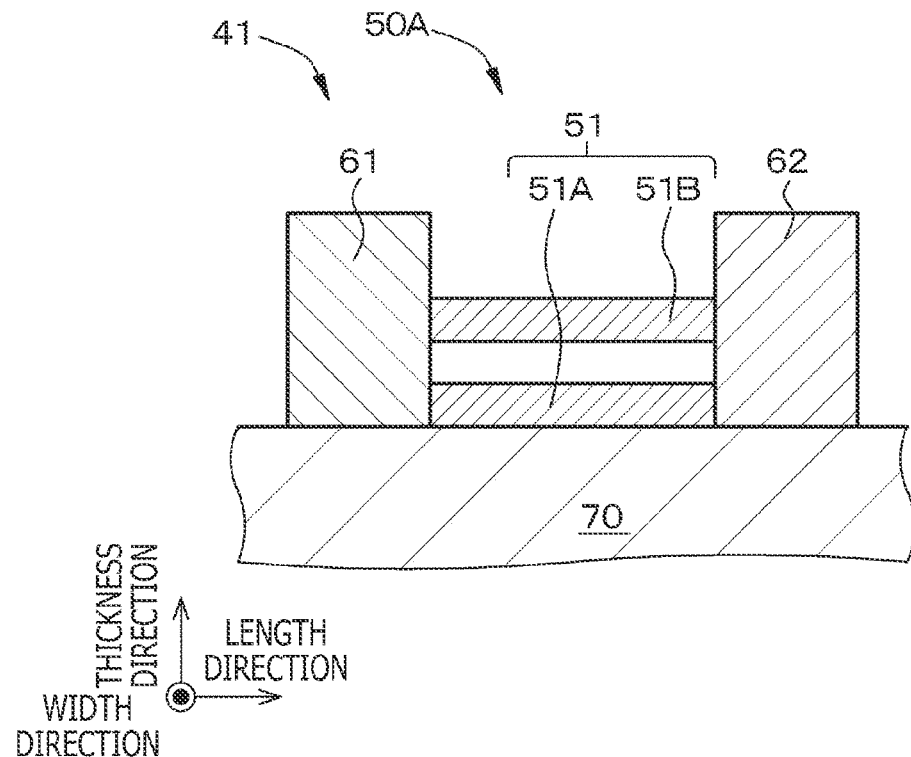
FIG. 5A and FIG. 5B are, respectively, a schematic, partially cross-sectional view of a p-channel field effect transistor taken along arrows A-A in FIG. 4A and a schematic, partially cross-sectional view of the p-channel field effect transistor taken along arrows B-B in FIG. 4B.
Figure 5B:
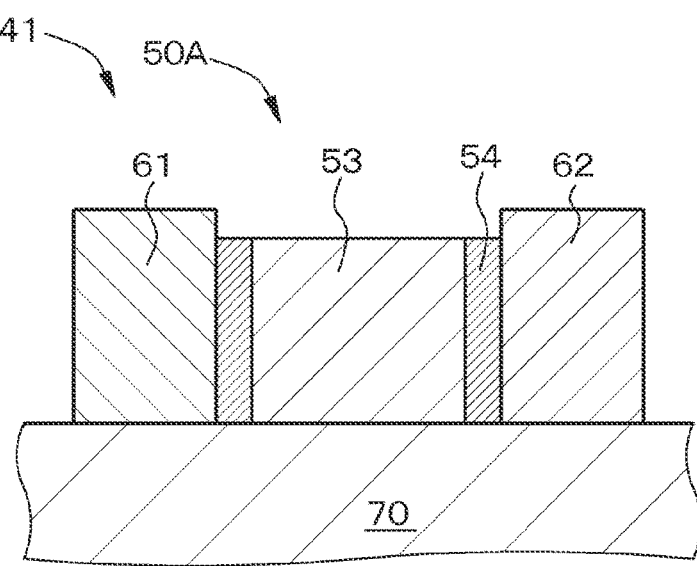
Figure 6A:
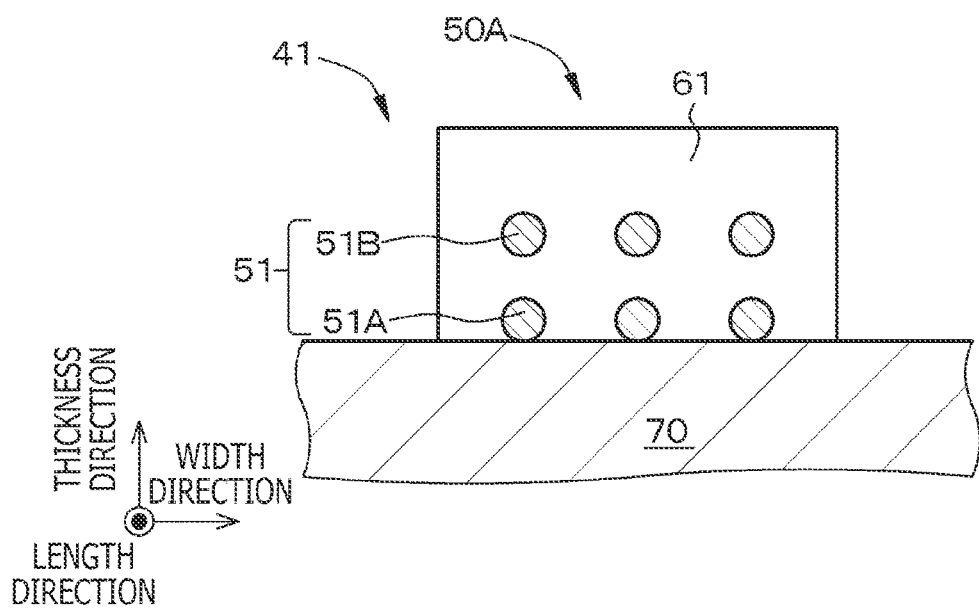
FIG. 6A and FIG. 6B are, respectively, a schematic, partially cross-sectional view of a p-channel field effect transistor taken along arrows C-C in FIG. 4A and a schematic, partially cross-sectional view of the p-channel field effect transistor taken along arrows D-D in FIG. 4B.
Figure 6B:
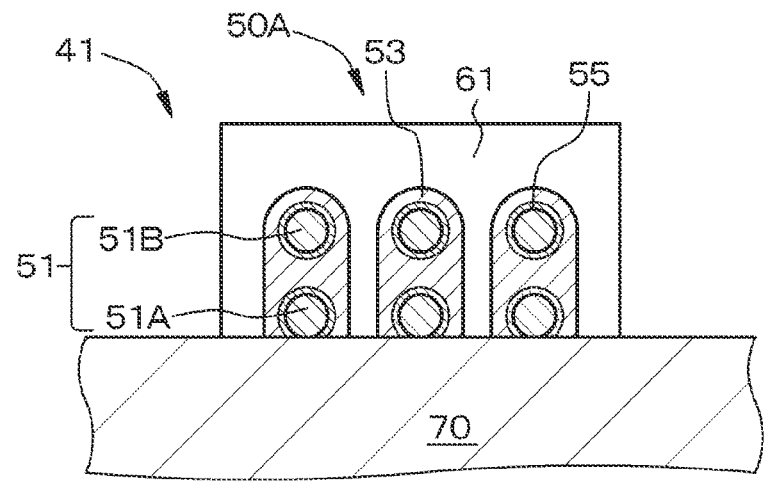
Figure 7A:
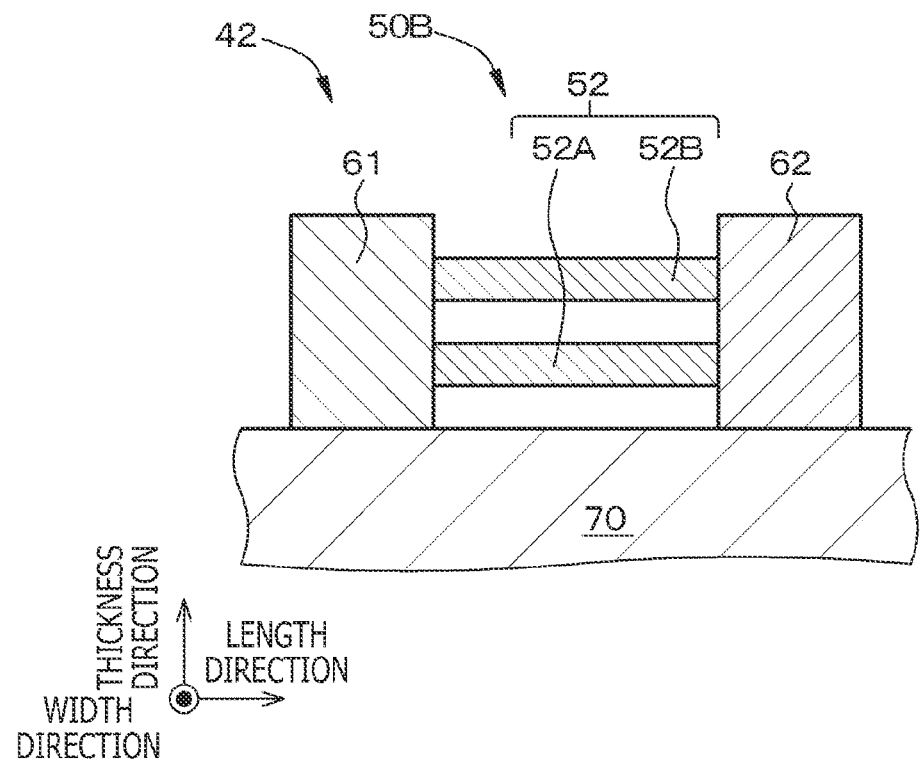
FIG. 7A and FIG. 7B are, respectively, a schematic, partially cross-sectional view of an n-channel field effect transistor taken along arrows A-A in FIG. 4A and a schematic, partially cross-sectional view of the n-channel field effect transistor taken along arrows B-B in FIG. 4B.
Figure 7B:
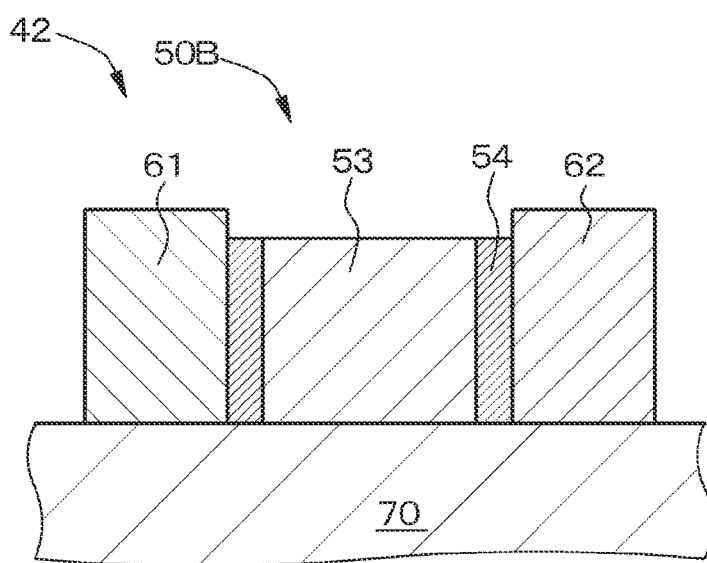
Figure 8A:
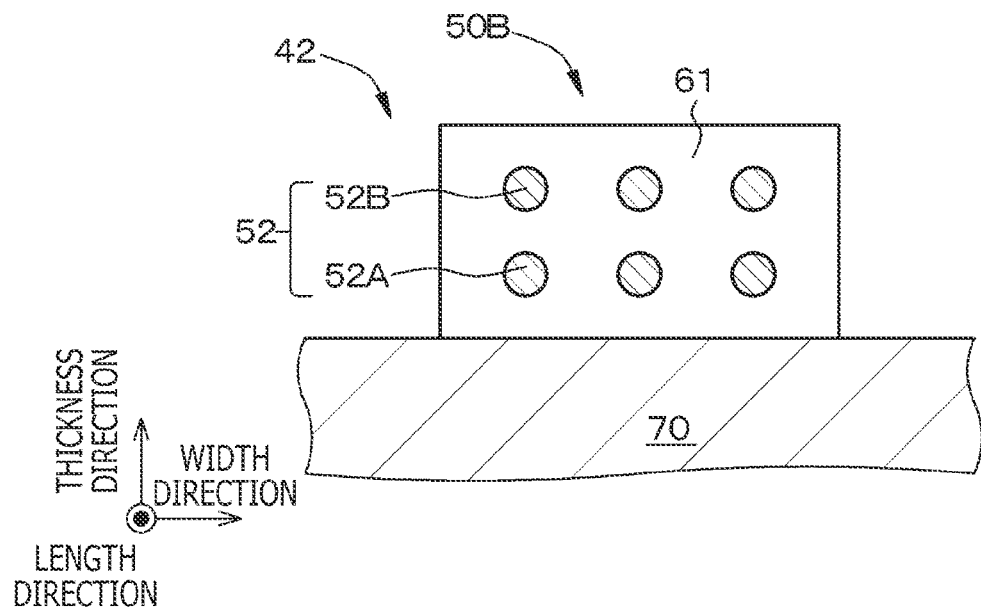
FIG. 8A and FIG. 8B are, respectively, a schematic, partially cross-sectional view of an n-channel field effect transistor taken along arrows C-C in FIG. 4A and a schematic, partially cross-sectional view of the n-channel field effect transistor taken along arrows D-D in FIG. 4B.
Figure 8B:
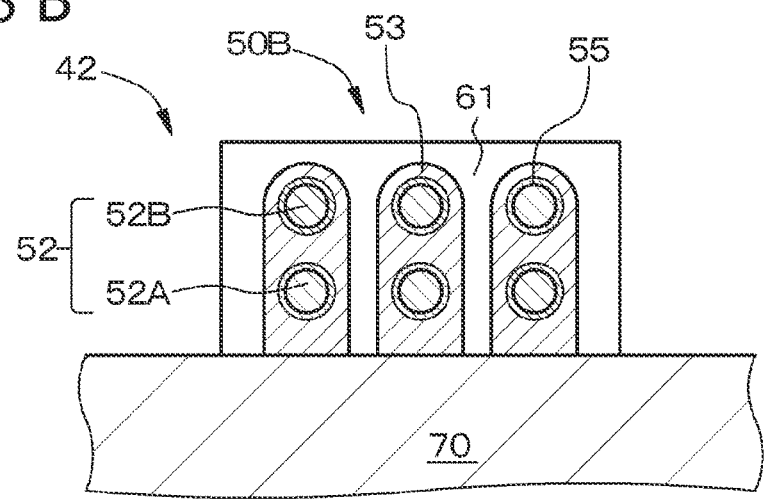

Example 1 relates to a diode according to a first mode of the present disclosure. FIG. 2A illustrates a schematic layout diagram of a stacked structure, a first connection section, and a second connection section of a diode of Example 1, and FIG. 2B illustrates a schematic layout diagram of a control electrode section, an insulating layer, the first connection section, and the second connection section of the diode of Example 1. FIG. 1A illustrates a schematic, partially cross-sectional view of the diode of Example 1 taken along arrows A-A in FIG. 2A, and FIG. 1B illustrates a schematic, partially cross-sectional view of the diode of Example 1 taken along arrows B-B in FIG. 2A. FIG. 3A illustrates a schematic, partially cross-sectional view of the diode of Example 1 taken along arrows C-C in FIG. 2A, and FIG. 3B illustrates a schematic, partially cross-sectional view of the diode of Example 1 taken along arrows D-D in FIG. 2B. Additionally, FIG. 4A illustrates a schematic layout diagram of a channel section and a source-drain region of a field effect transistor in Example 1, and FIG. 4B illustrates a schematic layout diagram of a gate electrode, a gate sidewall, and the source-drain region of the field effect transistor in Example 1. FIG. 5A and FIG. 7A illustrate schematic, partially cross-sectional views of a p-channel and an n-channel field effect transistors taken along arrows A-A in FIG. 4A, and FIG. 5B and FIG. 7B illustrate schematic, partially cross-sectional views of the p-channel and n-channel field effect transistors taken along arrows B-B in FIG. 4B. FIG. 6A and FIG. 8A illustrate schematic, partially cross-sectional views of the p-channel and n-channel field effect transistors taken along arrows C-C in FIG. 4A, and FIG. 6B and FIG. 8B illustrate schematic, partially cross-sectional views of the p-channel and n-channel field effect transistors taken along arrows D-D in FIG. 4B.

The diode of Example 1 or Example 2 described below includes:

a stacked structure 20 or 25;

a first connection section 31 provided at one end of the stacked structure 20 or 25 in a length direction; and a second connection section 32 provided at the other end of the stacked structure in the length direction.

The stacked structure 20 or 25 includes a first structure 21 or 26 with a nanowire structure or a nanosheet structure (specifically, a nanowire structure) and a second structure 22 or 27 with a nanowire structure or a nanosheet structure (specifically, a nanowire structure) including a material different from a material constituting the first structure 21 or 26, the first structure and the second structure being stacked alternately in a thickness direction.

The first connection section 31 has a first conductivity type (specifically, for example, a p type).

The second connection section 32 has a second conductivity type (specifically, for example, an n type) different from the first conductivity type.

The diode of Example 1 further includes a control electrode section 23 formed to extend at least from a top portion to a side surface of the stacked structure 20 and spaced apart from the first connection section 31 and the second connection section 32, and the first connection section 31 and the control electrode section 23 or the second connection section 32 and the control electrode section 23 are connected electrically. Specifically a diode 11A of Example 1 further includes the control electrode section 23 formed to extend at least from the top portion to the side surface of the stacked structure 20 and spaced apart from the first connection section 31 and the second connection section 32, and the first connection section 31 and the control electrode section 23 are connected electrically. In other words, the diode of Example 1 has what is called a MOS diode structure.

In the diode of Example 1 or Example 2 described below, the stacked structure 20 or 25 is provided on a base 70. In such a configuration, a bottom surface of the stacked structure 20 or 25 is in contact with the base 70. In the diode 11A of Example 1, the control electrode section 23 is not formed on the bottom surface of the stacked structure 20. Additionally, in the diode of Example 1 or Example 2 described below, the stacked structure 20 or 25 specifically includes two first structures 21A and 21B or 26A and 26B and two second structures 22A and 22B or 27A and 27B stacked alternately in the thickness direction and has a four-layer configuration. Each of the structures is, for example, 8 nm in thickness (thickness of each layer) and 8 nm in width. The stacked structure 20 or 25 is in contact with the first connection section 31 at the one end of the stacked structure 20 or 25 in the length direction and with the second connection section 32 at the other end of the stacked structure 20 or 25 in the length direction. The lowermost layer of the stacked structure 20 or 25 may include the first structure 21A or 26A or the second structure 22A or 27A. In the illustrated example, the lowermost layer includes the first structure 21A or 26A.

In the diode of Example 1 or Example 2 described below, the base 70 includes a silicon semiconductor substrate. Additionally, in the diode of Example 1 or Example 2 described below, the first connection section 31 and the second connection section 32 are provided on the base 70. Further, in the diode of Example 1 or Example 2 described below, the first structure 21 and the first connection section 31 include silicon-germanium (Si—Ge), and the second structure 22 and the second connection section 32 include silicon (Si). Additionally, the diode 11A of Example 1 includes an insulating layer (sidewall) 24 formed on a side surface of the control electrode section 23 facing the first connection section 31 and on a side surface of the control electrode section 23 facing the second connection section 32, the insulating layer 24 including, for example, $HfO_2$. The control electrode section 23 includes TiN, TaN, Al, TiAl, or W, and specifically, for example, includes TiN. The control electrode section 23 is, for example, 0.1 μm in length, and the distance between the first connection section 31 and the second connection section 32 is 0.14 μm.

Further, in the diode 11A of Example 1, the stacked structure 20 includes an intrinsic semiconductor region (intrinsic region) or has an impurity concentration of $1 \times 10^{18}/cm^3$ or less. Specifically, the first structure 21 and the second structure 22 include an intrinsic semiconductor region or have an impurity concentration of $1 \times 10^{18}/cm^3$ or less.

In Example 1 or Example 2 described below, a semiconductor apparatus includes the diode of Example 1 or Example 2 and a field effect transistor 42 with a GAA structure (the gate electrode seamlessly and continuously surrounds an outer peripheral portion of the channel section) and a field effect transistor 41 with what is called an omega (Ω) structure (the gate electrode surrounds the outer peripheral portion of the channel section but partly discontinuously surrounds the outer peripheral portion).

The p-channel field effect transistor 41 includes a channel structure section 50A including plural channel sections 51 (51A and 51B) each with a nanowire structure or a nanosheet structure, gate insulating films 55 each surrounding a corresponding one of the channel sections 51 (51A and 51B), and a gate electrode 53 surrounding at least a part of each of the gate insulating films 55. On the other hand, the n-channel field effect transistor 42 includes a channel structure section 50B including plural channel sections 52 (52A and 52B) each with a nanowire structure or a nanosheet structure, the gate insulating films 55 each surrounding a corresponding one of the channel sections 52 (52A and 52B), and a gate electrode 53 surrounding at least a part of each of the gate insulating films 55. At least two channel sections 51 or 52 are formed in the thickness direction of the channel structure section 50, and the lowermost layer channel section 51 or 52 is formed on or above the base 70. In the illustrated example, two channel sections 51 (51A and 51B) are formed in the thickness direction of the channel structure section 50A, and the lowermost layer channel section 51A is formed on the base 70. The gate electrode 53 is formed between the lowermost layer channel section 51A and the base 70 (Ω structure). On the other hand, two channel sections 52 (52A and 52B) are formed in the thickness direction of the channel structure section 50B, and the lowermost layer channel section 52A is formed above the base 70. The gate electrode 53 is formed between the lowermost layer channel section 52A and the base 70 (GAA structure). Plural channel sections 51 and 52 are spaced apart from each other in the thickness direction of the channel structure section 50A or 50B, and the gate insulating film 55 and the gate electrode 53 are embedded between the channel section 51 or 52 and the channel section 51 or 52. One end of the channel section 51 or 52 is in contact with one source/drain region 61, and the other end of the channel section 51 or 52 is in contact with the other source/drain region 62. A gate sidewall 54 including, for example, $HfO_2$ is formed on a side surface of the gate electrode 53 facing each of the source/drain regions 61 and 62.

As described above, at least a part of the lowermost layer channel section constituting the field effect transistor is surrounded by the gate electrode, and the other channel sections are surrounded by the gate electrode. In the illustrated example, a part of the outer peripheral portion of the lowermost layer channel section 51A constituting the field effect transistor 41 is not surrounded by the gate electrode 53. On the other hand, a part of the outer peripheral portion of the lowermost channel section 52A constituting the field effect transistor 42 is surrounded by the gate electrode 53.

The channel sections 51 (51A and 51B) of the field effect transistor 41 of Example 1 include silicon-germanium (Si—Ge), and the channel sections 52 (52A and 52B) of the field effect transistor 42 include silicon (Si). Additionally, a material used to form the gate electrode 53 of the field effect transistor 41 or 42 is TiN, and the gate insulating film 55 has a stacked structure of SiON and $HfO_2$.

Figure 15:
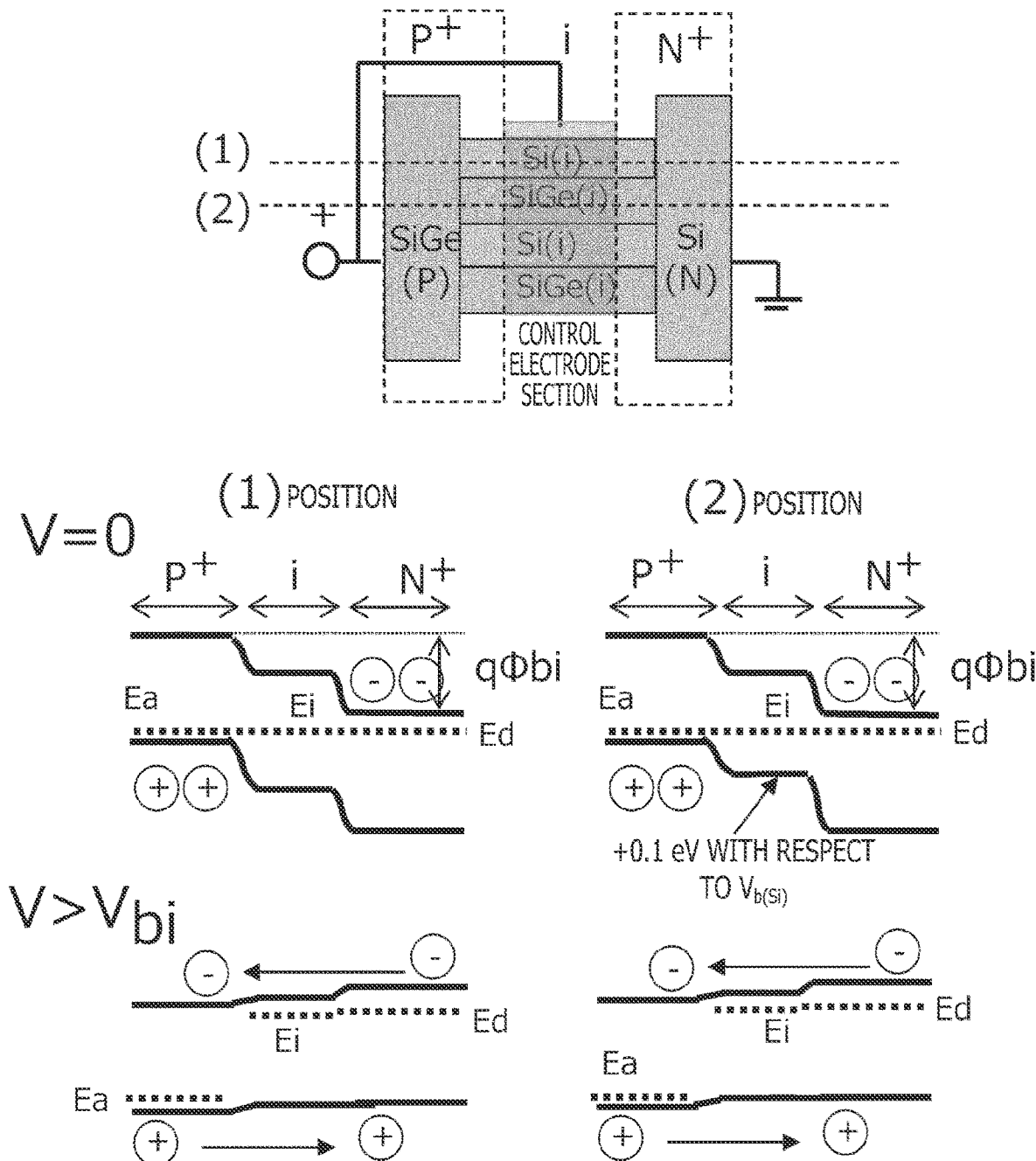
FIG. 15 is a diagram illustrating an operation mechanism of the diode of Example 1.
Figure 16:
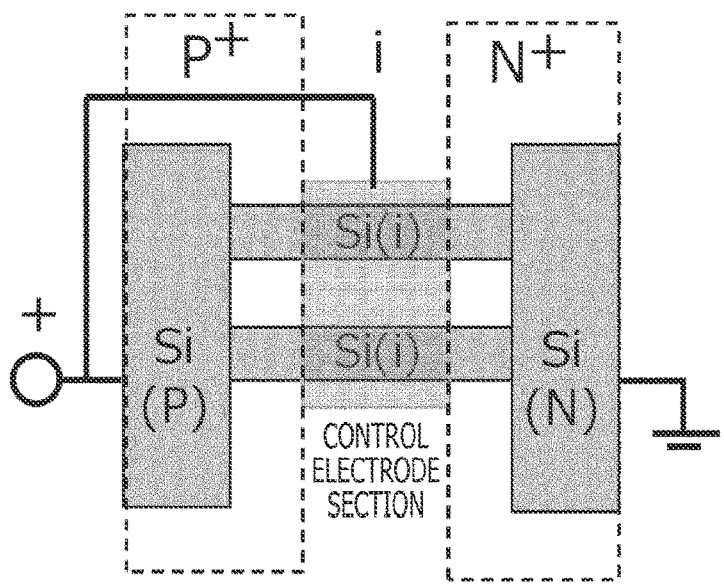
FIG. 16 is a diagram illustrating an operation mechanism of a diode proposed in NPL 1.
Figure 16:
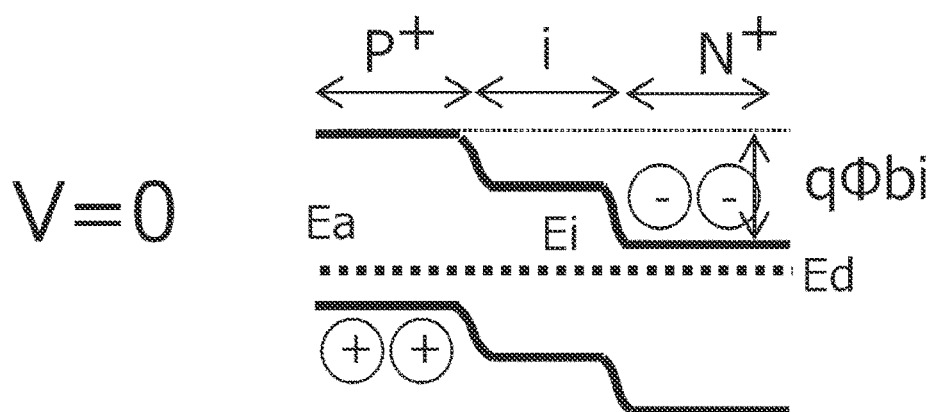
Figure 16:
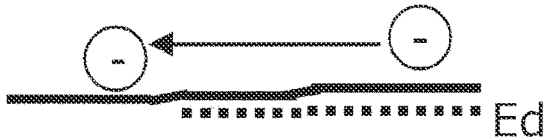
Figure 16:
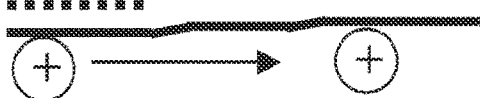

FIG. 15 is a diagram for describing an operation mechanism of the diode 11A of Example 1, and FIG. 16 illustrates a diagram for describing an operation mechanism of a diode with a GAA structure proposed in NPL 1 described above. Note that the uppermost diagrams in FIG. 15 and FIG. 16 are schematic cross-sectional views similar to FIG. 1A. "(1) position" in FIG. 15 is a diagram illustrating changes in the potential of the second structure 22B, and "(2) position" in FIG. 15 is a diagram illustrating changes in the potential of the first structure 21B. Additionally, "V=0" indicates a potential obtained when 0 V is applied to the first connection section 31 and the control electrode section 23, with the second connection section 32 grounded (0 V is applied to the second connection section 32). "V>$V_{bi}$" indicates a potential obtained when a voltage (for example, +1.0 V) higher than a substrate bias $V_{bi}$ (specifically, 0 V) is applied to the first connection section 31 and the control electrode section 23, with the second connection section 32 grounded (0 V is applied to the second connection section 32).

With reference to FIG. 20A, FIG. 20B, FIG. 20C, FIG. 21A, FIG. 21B, FIG. 21C, FIG. 22A, FIG. 22B, FIG. 22C, FIG. 23A, FIG. 23B, FIG. 23C, FIG. 24A, FIG. 24B, FIG. 24C, FIG. 25A, FIG. 25B, and FIG. 25C, an overview of the diode and the field effect transistor in Example 1 will be provided. Note that FIG. 20A, FIG. 20B, FIG. 20C, FIG. 21A, FIG. 21B, FIG. 21C, FIG. 22A, FIG. 22B, FIG. 22C, FIG. 23A, FIG. 23B, FIG. 23C, FIG. 24A, FIG. 24B, and FIG. 24C are schematic, partially cross-sectional views of the base and the like, as in a case of being taken along arrows C-C in FIG. 2A and FIG. 4A, and FIG. 25A, FIG. 25B, and FIG. 25C are schematic, partially cross-sectional views of the base and the like, as in a case of being taken along arrows A-A in FIG. 2A and FIG. 4A.

[Step-100]

First, on a desired region of the base 70, an element isolation region (not illustrated) for the diode and the field effect transistor is formed, and then the following are sequentially formed, for example, on the basis of an epitaxial CVD method: a first semiconductor layer 81 including Si—Ge (semiconductor layer constituting the first structure 21A and the channel section 51A of the p-channel field effect transistor 41), a second semiconductor layer 82 including Si (semiconductor layer constituting the second structure 22A and the channel section 52A of the n-channel field effect transistor 42), a third semiconductor layer 83 including Si—Ge (semiconductor layer constituting the first structure 21B and the channel section 51B of the p-channel field effect transistor 41), and a fourth semiconductor layer 84 including Si (semiconductor layer constituting the second structure 22B and the channel section 52B of the n-channel field effect transistor 42). The first semiconductor layer 81, the second semiconductor layer 82, the third semiconductor layer 83, and the fourth semiconductor layer 84 each include an intrinsic semiconductor or has an impurity concentration of $1\times10^{18}/cm^3$ or less.

[Step-110]

Then, the stacked structure 20 and stacked structures 20' and 20" including the first semiconductor layer 81, the second semiconductor layer 82, the third semiconductor layer 83, and the fourth semiconductor layer 84 (stacked structures for forming the channel structure sections 50A and 50B) are each formed on the base 70 on which the diode 11A is to be formed and on the base 70 on which the field effect transistor is to be formed, on the basis of the well-known lithography technique and etching technique. Thus, structures illustrated in FIG. 20A, FIG. 20B, and FIG. 20C can be obtained.

[Step-120A]

Subsequently, the stacked structure 20 and the stacked structure 20" for forming the channel structure section 50B of the n-channel field effect transistor 42 are covered with an appropriate mask layer, with the stacked structure 20' exposed, the stacked structure 20' being used to form the channel structure section 50A of the p-channel field effect transistor 41. Then, an etching resist 91 with a desired resist pattern is formed (see FIG. 21A), and the fourth semiconductor layer 84, the third semiconductor layer 83, the second semiconductor layer 82, and the first semiconductor layer 81 are patterned. Depending on the width of the etching resist 91, a nanosheet structure is obtained or a nanosheet structure is obtained. Consequently, a structure illustrated in FIG. 21B can be obtained.

[Step-120B]

Then, the second semiconductor layer 82 and the fourth semiconductor layer 84 including Si are removed, by using an etchant with an etching selectivity for the material (Si—Ge) constituting the first semiconductor layer 81 and the third semiconductor layer 83. The channel section 52 including the nanowire structure is supported at both ends of the channel section 52 by a support section including the stacked structure 20'. Subsequently, the etching resist 91 is removed. Consequently, a structure illustrated in FIG. 21C can be obtained.

[Step-130A]

Subsequently, the components of the channel structure section 50A of the p-channel field effect transistor 41 are covered with a mask layer, with the stacked structure 20" exposed, the stacked structure 20" being used to form the channel structure section 50B of the n-channel field effect transistor 42. Then, an etching resist 92 with a desired resist pattern is formed (see FIG. 22A), and the fourth semiconductor layer 84, the third semiconductor layer 83, the second semiconductor layer 82, and the first semiconductor layer 81 are patterned. Depending on the width of the etching resist 92, a nanowire structure is obtained or a nanosheet structure is obtained. Consequently, structures illustrated in FIG. 22B and FIG. 23C can be obtained.

[Step-130B]

Then, the first semiconductor layer 81 and the third semiconductor layer 83 including Si—Ge are removed, by using an etchant with an etching selectivity for the material (Si) constituting the second semiconductor layer 82 and the fourth semiconductor layer 84. The channel section 51 including the nanowire structure is supported at both ends of the channel section 51 by a support section including the stacked structure 20". Subsequently, the etching resist 92 is removed. Consequently, a structure illustrated in FIG. 22C can be obtained.

[Step-140]

Subsequently, a gate insulating film 55 is formed on the channel section 51 or 52. Specifically, first, a resist layer with a desired resist pattern (not illustrated) is formed, and then thermal oxidation treatment is executed on the channel sections 51 or 52 to form a part of the gate insulating film including SiON. The thermal oxidation treatment makes the cross-section of the channel section 51 or 52 including the nanowire structure circular. Then, the remaining portion of the gate insulating film including $HfO_2$ is formed on the gate insulating film on the basis of the ALD method. Consequently, structures illustrated in FIG. 23A and FIG. 23B can be obtained.

[Step-150]

Then, in a part of the stacked structure 20 constituting the diode 11A, the control electrode section 23 is formed on the basis of the CVD method, a lithography technique, and the etching technique. In addition, the gate electrodes 53 of the p-channel field effect transistor 41 and the n-channel field effect transistor 42 are formed on the basis of the CVD method, the lithography technique, and the etching technique (see FIGS. 24A, 24B, and 24C). Subsequently, the insulating layer (sidewall) 24 and the gate sidewall 54 are formed by a well-known method.

[Step-160]

Then, the first connection section 31, the second connection section 32, and the source/drain regions 61 and 62 are formed. Specifically, the support section including the stacked structure 20' or 20" supporting both ends of the channel section 51 or 52 is removed on the basis of the lithography technique and the etching technique, and unnecessary portions are removed from the stacked structure 20 on the basis of the lithography technique and the etching technique to expose the base 70. Then, the entire region of the base 70 except for the region on which the first connection section 31 is to be formed is covered with a mask layer including, for example, SiN (not illustrated). Then, the first connection section 31 including Si—Ge with p-type impurities is formed on the base 70 on the basis of a selective epitaxial growth method, and then the mask layer is removed. Then, the entire region of the base 70 except for the region on which the second connection section 32 and the source/drain regions 61 and 62 are to be formed is covered with another mask layer including, for example, SiN (not illustrated). Then, the second connection section 32 including Si with n-type impurities and the source/drain regions 61 and 62 are formed on the base 70 on the basis of the selective epitaxial growth method, and then the mask layer is removed. Consequently, the diode 11A and the field effect transistor 41 or 42 with the nanowire structure can be obtained. Further, it is sufficient that an interlayer insulating layer is formed all over the surface, an opening is formed in the interlayer insulating layer located above the first connection section 31, the second connection section 32, and the control electrode section 23, and a connection hole, wiring, and a connection section (connection section connecting the first connection section 31 and the control electrode section 23) are formed to extend from the inside of the opening onto the interlayer insulating layer. Additionally, it is sufficient that an opening is formed in the interlayer insulating layer located above the gate electrode 53 and the source/drain regions 61 and 62, and a connection hole and wiring are formed to extend from the inside of the opening onto the interlayer insulating layer.

Figure 17A:
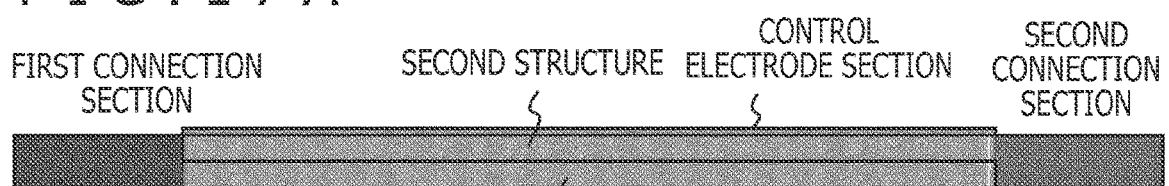
FIG. 17A, FIG. 17B, FIG. 17C, and FIG. 17D are diagrams illustrating a diode having a structure similar to the structure of the diode of Example 1, and results of simulation of a potential distribution, an electric field intensity distribution, and a current density distribution in a stacked structure of the diode.
Figure 17B:
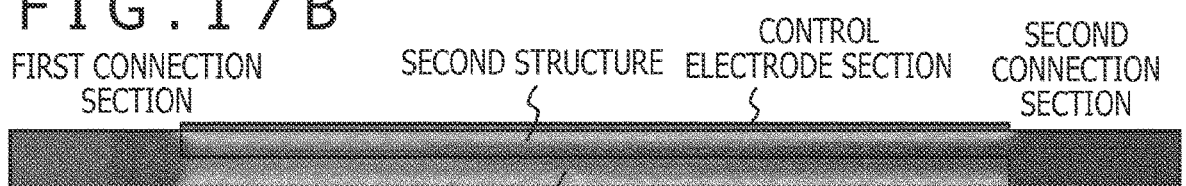
Figure 17C:
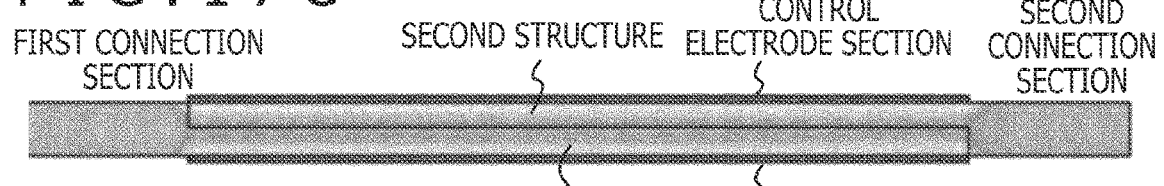
Figure 17D:
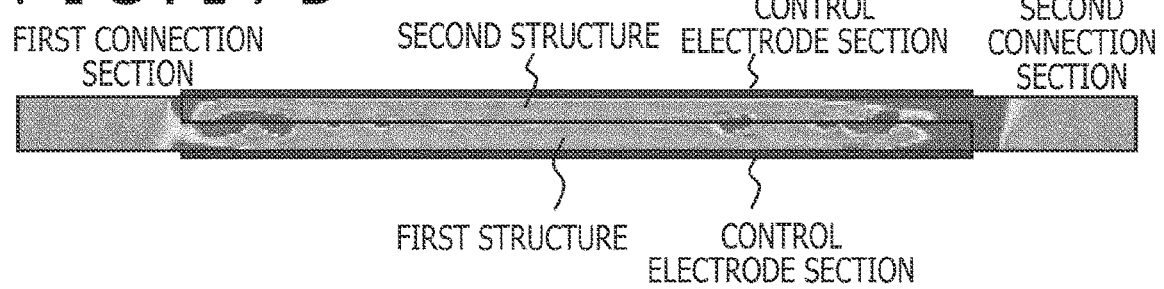

FIG. 17B, FIG. 17C, and FIG. 17D illustrate a diode (hereinafter referred to as a "diode for simulation" for convenience) with a structure similar to the structure of the diode of Example 1 illustrated in FIG. 17A and the results of simulation of a potential distribution, an electric field intensity distribution, and a current density distribution in the stacked structure of the diode for simulation. The diode for simulation includes the first connection section 31 including Si—Ge, the second connection section 32 including Si, the stacked structure 20 with a total of two layers of one first structure 21 including Si—Ge and one second structure 22 including Sie, the layers being stacked, and the control electrode section 23 surrounding the outer peripheral portion of the stacked structure 20. Then, a state was simulated in which +1.0 V is applied to the first connection section 31 and in which the control electrode section 23 and the second connection section 32 is grounded (0 V is applied to the second connection section 32). The results in FIG. 17B, FIG. 17C, and FIG. 17D indicate no difference in potential distribution, electric field intensity distribution, and current density distribution between the first structure 21 and the second structure 22, allowing diode operations to be confirmed.

Figure 18:
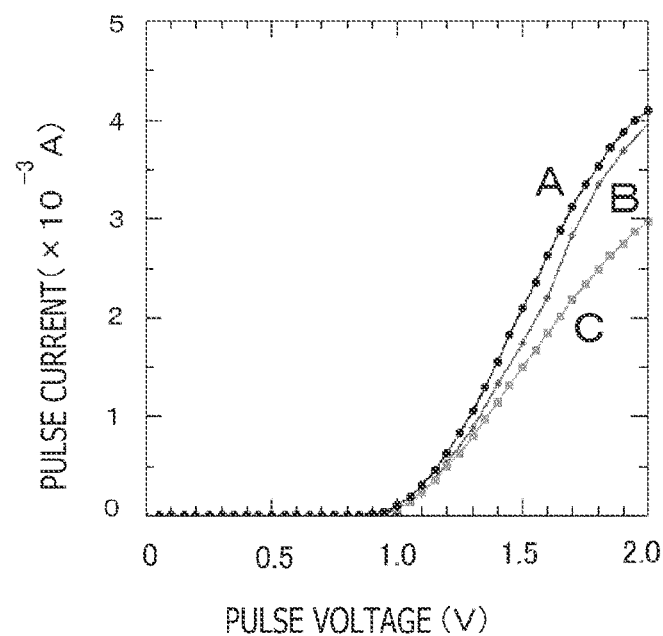
FIG. 18 is a diagram illustrating results of simulation of a pulse current flowing when a pulse voltage is applied in a diode having a structure similar to the structure of the diode of Example 1 illustrated in FIG. 17A, a diode corresponding to the diode of Example 1 illustrated in FIG. 17A in which the stacked structure is replaced with two silicon layers, and a diode corresponding to the diode of Example 1 illustrated in FIG. 17A in which stacked structure is replaced with two silicon-germanium layers.

Additionally, FIG. 18 illustrate the results of simulation of a pulse current flowing when a pulse voltage is applied in the diode for simulation illustrated in FIG. 17A, a diode corresponding to the diode for simulation illustrated in FIG. 17A in which the stacked structure is replaced with two silicon layers (hereinafter referred to as a "diode of Comparative Example 1A" for convenience), and a diode corresponding to the diode for simulation illustrated in FIG. 17A in which the stacked structure is replaced with two silicon-germanium layers (hereinafter referred to as a "diode of Comparative Example 1B" for convenience). Note that "B" in FIG. 18 illustrates the results for the diode for simulation, "A" in FIG. 18 illustrates the results for the diode of Comparative Example 1A, and (C) in FIG. 18 illustrates the results for the diode of Comparative Example 1B. FIG. 18 allows confirmation that the diode for simulation has operating characteristics substantially similar to the operating characteristics of the diode of Comparative Example 1A and has more excellent characteristics than the diode of Comparative Example 1B.

Figure 19:
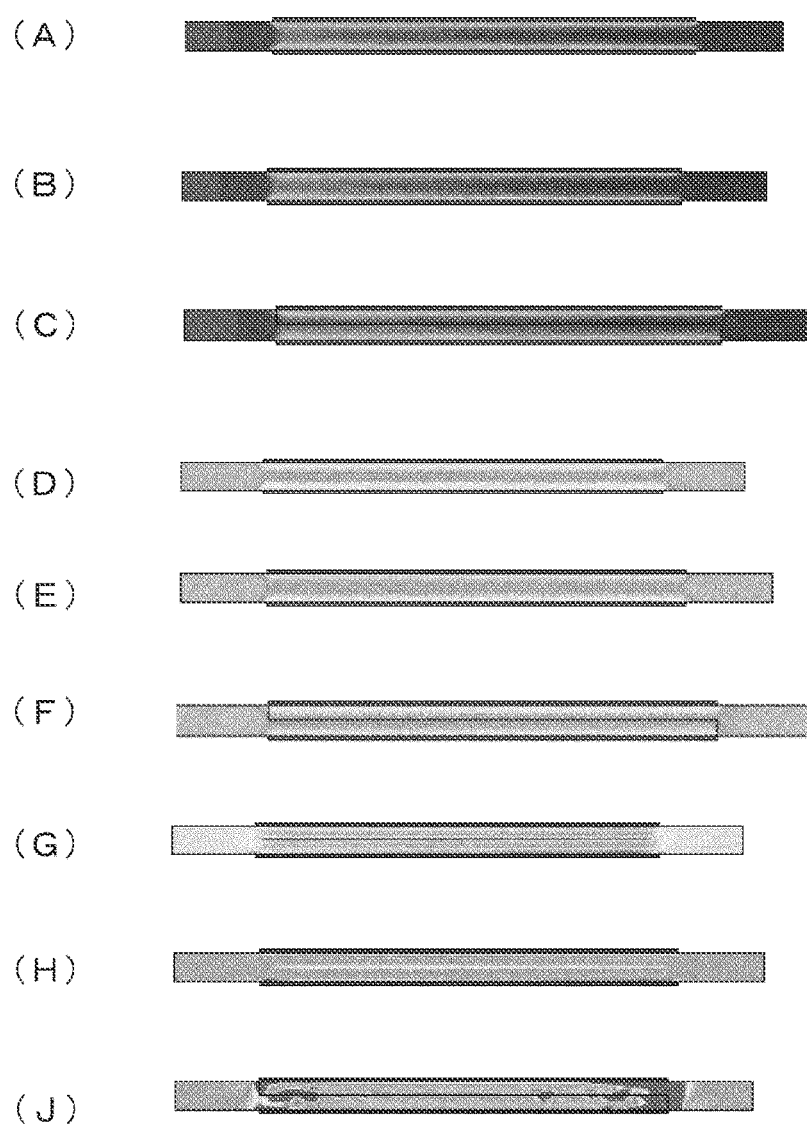
FIG. 19 (A), (B), (C), (D), (E), (F), (G), (H), and (J) of FIG. 19 are diagrams illustrating results of simulation of a potential distribution, an electric field intensity distribution, and a current density distribution in the stacked structure of the diode having a structure similar to the structure of the diode of Example 1 illustrated in FIG. 17A, the diode corresponding to the diode of Example 1 illustrated in FIG. 17A in which the stacked structure is replaced with two silicon layers, and the diode corresponding to the diode of Example 1 illustrated in FIG. 17A in which stacked structure is replaced with two silicon-germanium layers.
Figure 20A:
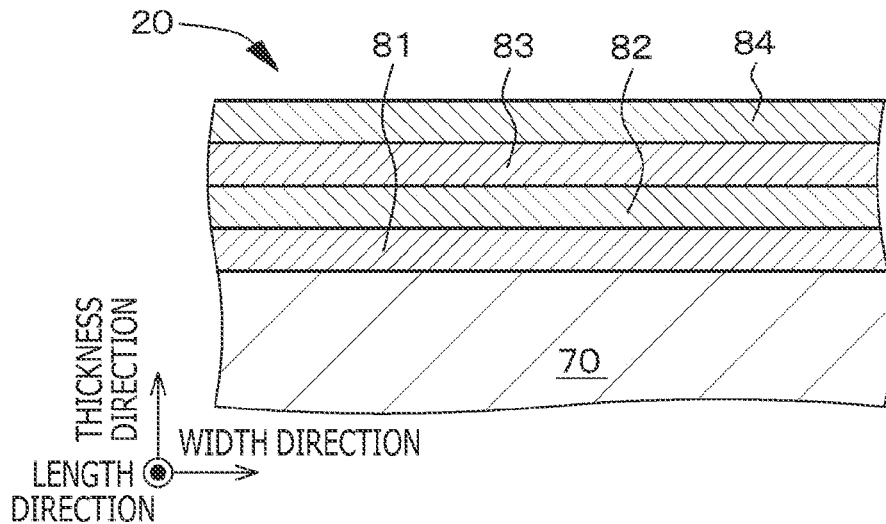
FIG. 20A, FIG. 20B, and FIG. 20C are schematic, partially cross-sectional views of a base and the like for providing an overview of a method for manufacturing the diode and the field effect transistor in Example 1.
Figure 20B:
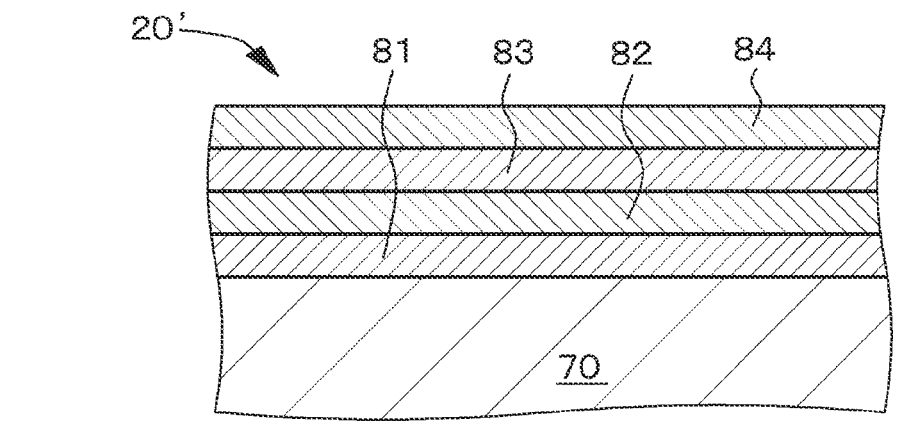
Figure 20C:
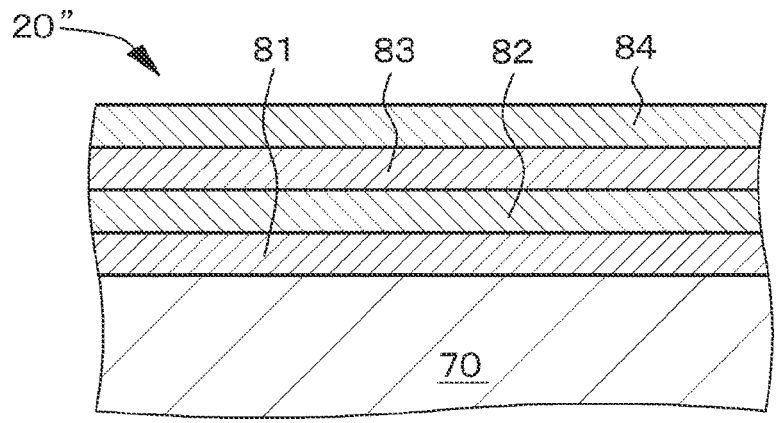
Figure 21A:
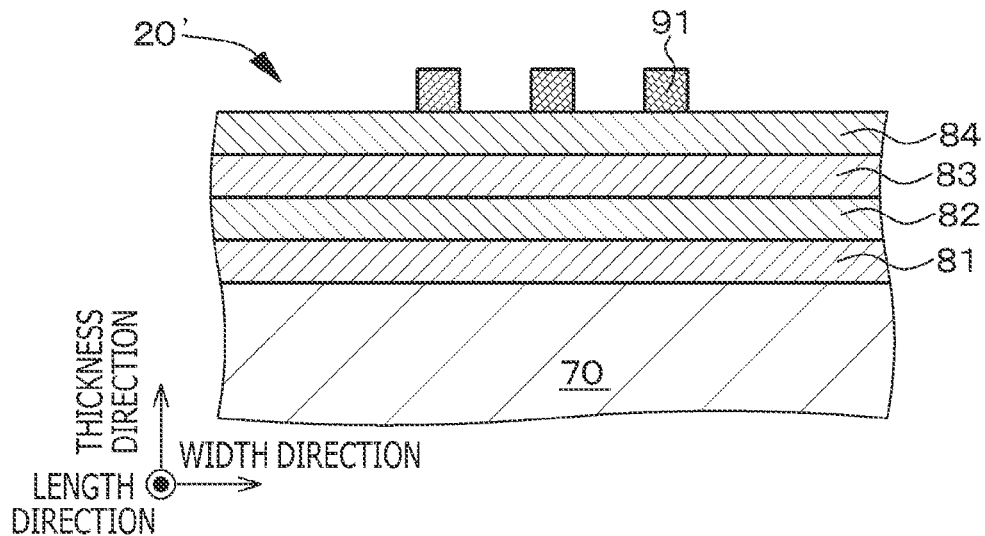
FIG. 21A, FIG. 21B, and FIG. 21C are schematic, partially cross-sectional views of a base and the like for providing an overview of a method for manufacturing the diode and the field effect transistor in Example 1.
Figure 21B:
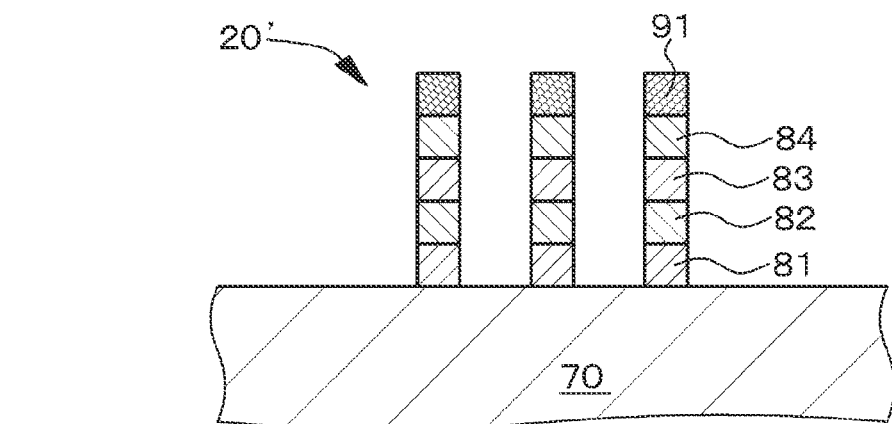
Figure 21C:
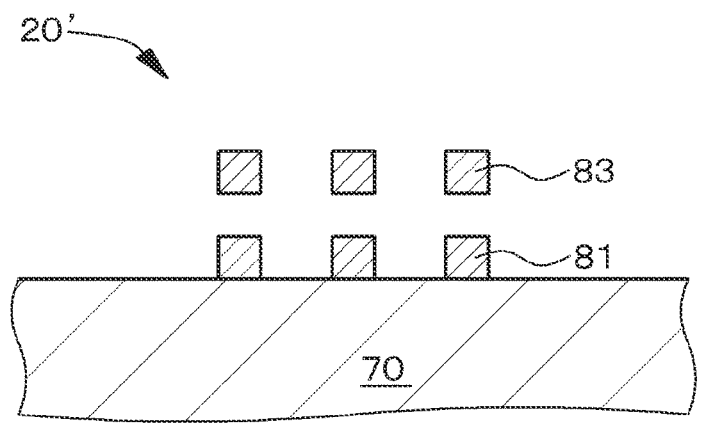
Figure 22A:
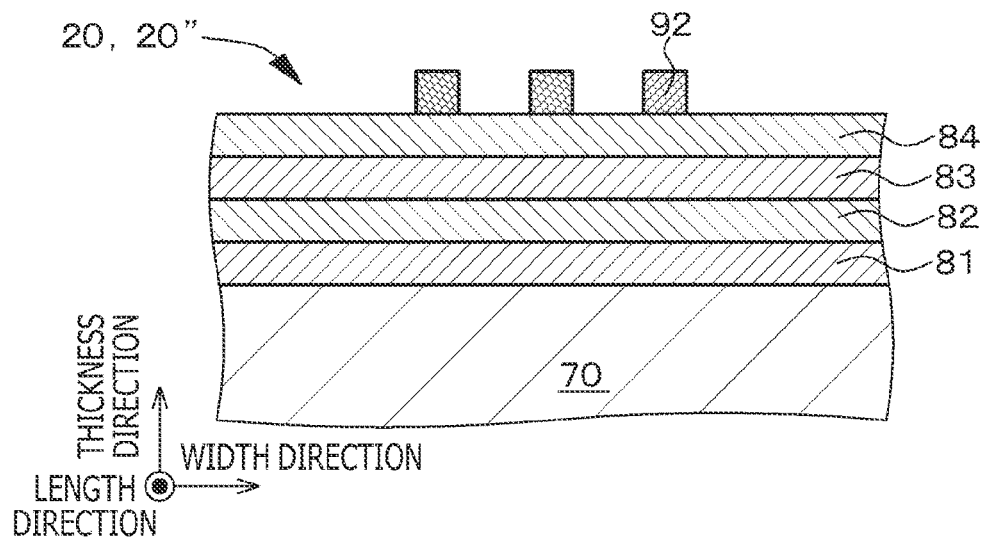
FIG. 22A, FIG. 22B, and FIG. 22C are schematic, partially cross-sectional views of a base and the like for providing an overview of a method for manufacturing the diode and the field effect transistor in Example 1.
Figure 22B:
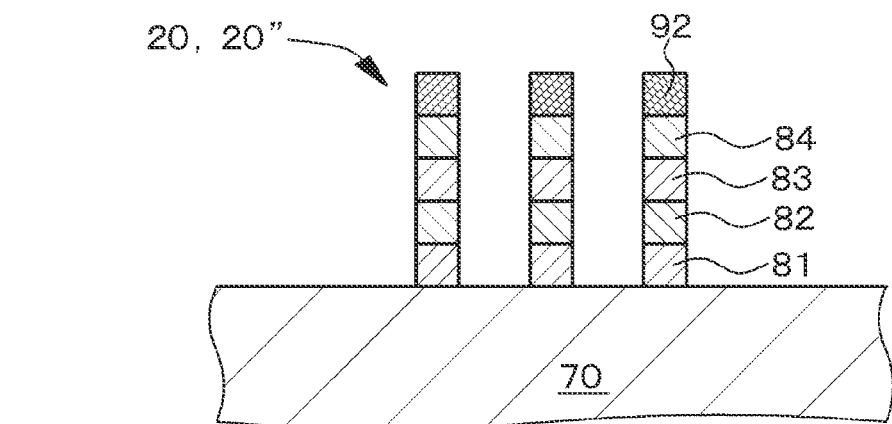
Figure 22C:
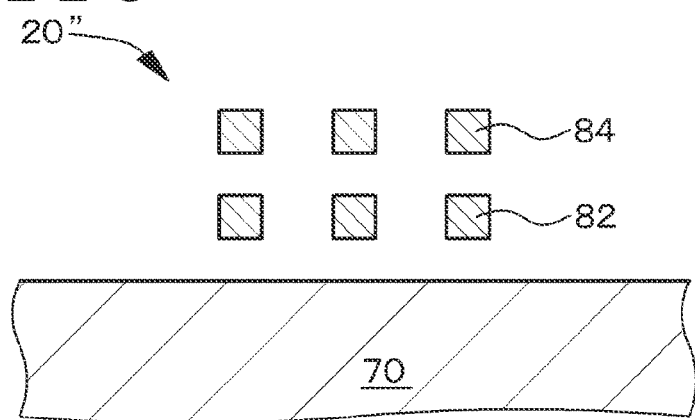
Figure 23A:
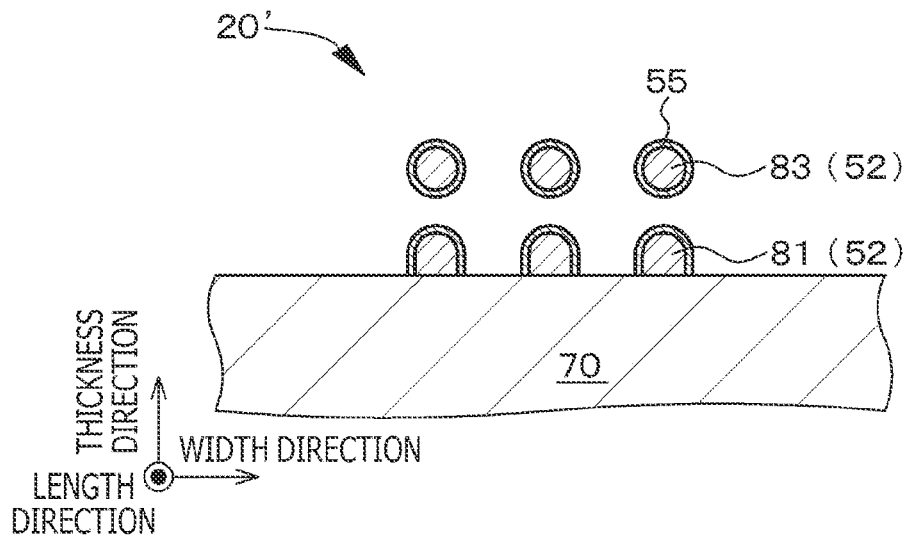
FIG. 23A, FIG. 23B, and FIG. 23C are schematic, partially cross-sectional views of a base and the like for providing an overview of a method for manufacturing the diode and the field effect transistor in Example 1.
Figure 23B:
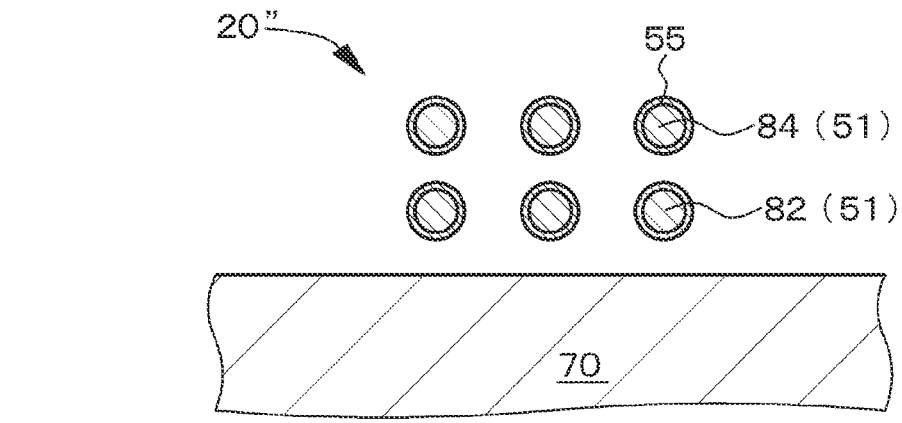
Figure 23C:
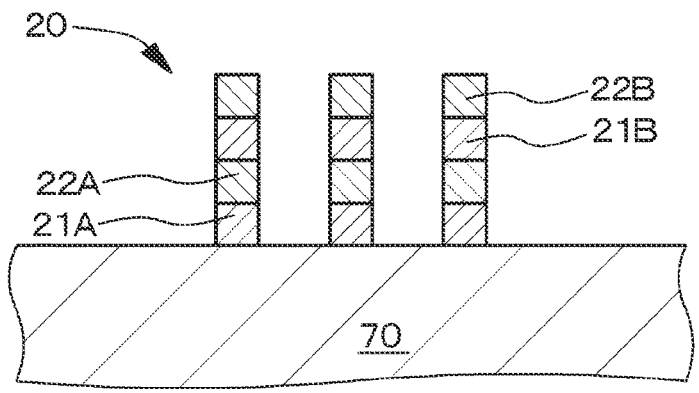
Figure 24A:
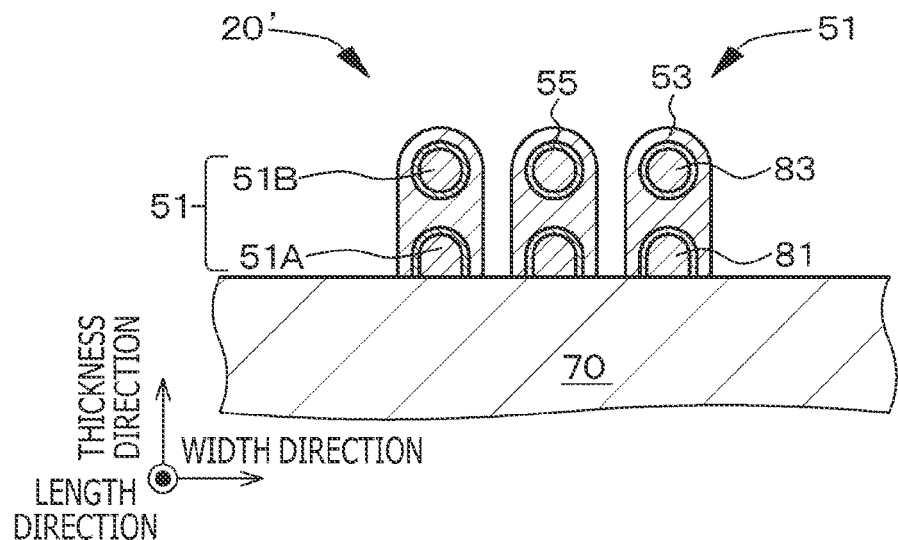
FIG. 24A, FIG. 24B, and FIG. 24C are schematic, partially cross-sectional views of a base and the like for providing an overview of a method for manufacturing the diode and the field effect transistor in Example 1.
Figure 24B:
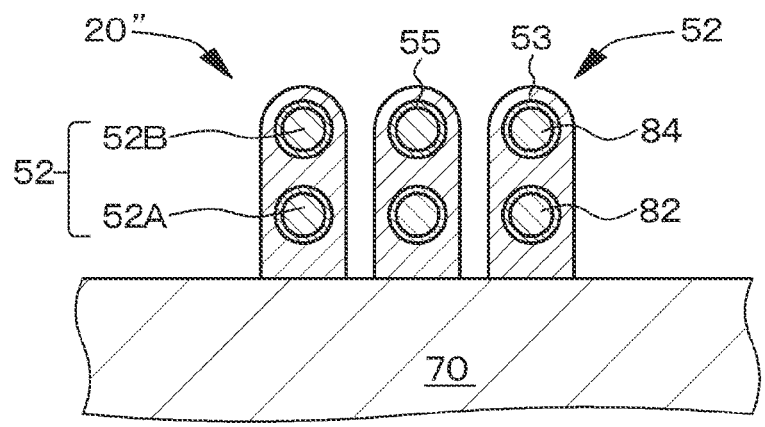
Figure 24C:
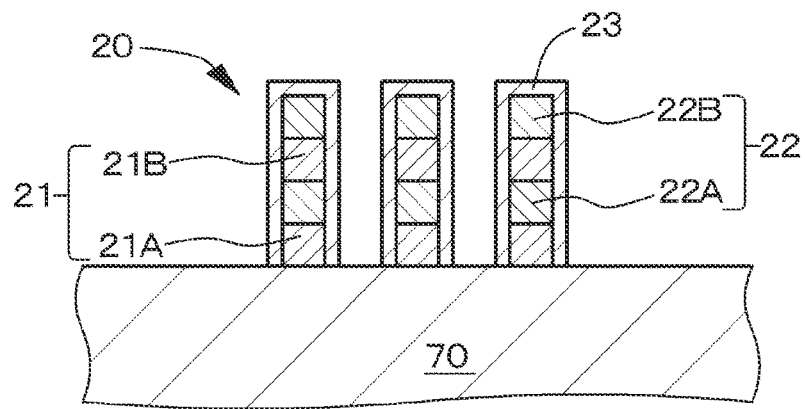
Figure 25A:
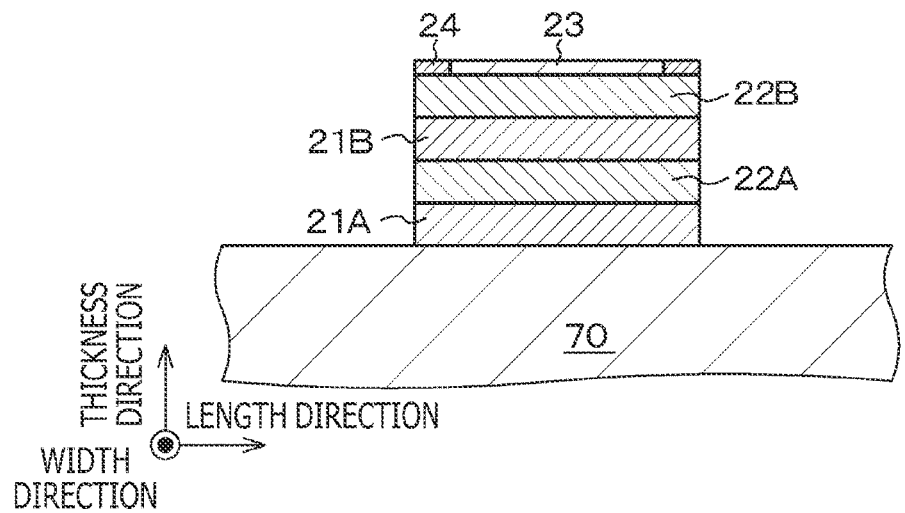
FIG. 25A, FIG. 25B, and FIG. 25C are schematic, partially cross-sectional views of a base and the like for providing an overview of a method for manufacturing the diode and the field effect transistor in Example 1.
Figure 25B:
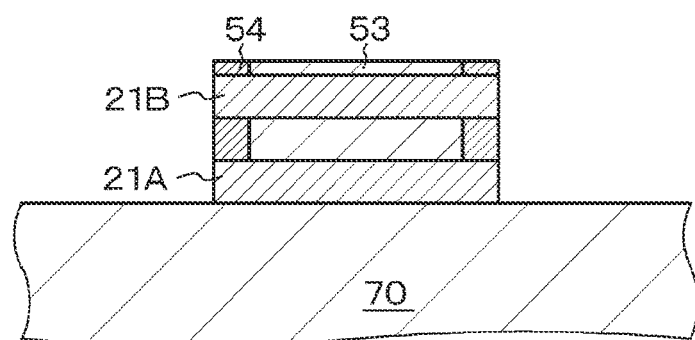
Figure 25C:
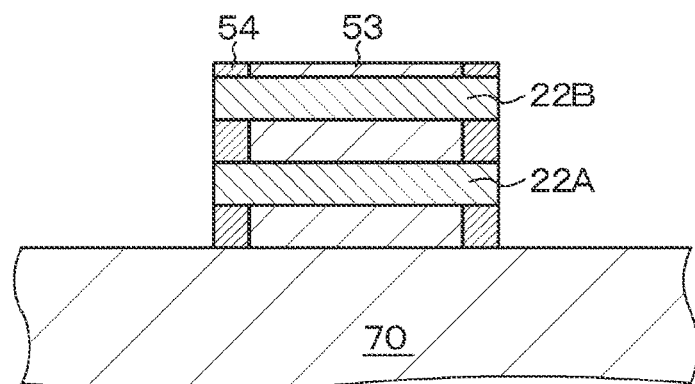

Further, FIG. 19 illustrates the results of simulation of a potential distribution, an electric field intensity distribution, and a current density distribution in the stacked structures of the diode for simulation, the diode of Comparative Example 1A, and the diode of Comparative Example 1B.

[Potential Distribution]
 Diode for simulation See FIG. 19(C)
 Diode of Comparative Example 1A See FIG. 19(A)
 Diode of Comparative Example 1B See FIG. 19(B)

[Electric Field Intensity Distribution]
 Diode for simulation See FIG. 19(F)
 Diode of Comparative Example 1A See FIG. 19(D)
 Diode of Comparative Example 1B See FIG. 19(E)

[Current Density Distribution]
 Diode for simulation See FIG. 19(J)
 Diode of Comparative Example 1A See FIG. 19(G)
 Diode of Comparative Example 1B See FIG. 19(H)

The results in FIG. 19 indicates no significant difference between an upper layer and a lower layer constituting the stacked structure in the potential distribution, the electric field intensity distribution, and the current density distribution in the stacked structures of the diode for simulation, the diode of Comparative Example 1A, and the diode of Comparative Example 1B.

The diode of Example 1 or Example 2 described below includes the stacked structure including the first structure and the second structure each having the nanowire structure or the nanosheet structure and stacked alternately in the thickness direction, thus allowing maximum suppression of a decrease in current that can be passed through the diode. Further, the diode has, for example, a high affinity for manufacturing steps for field effect transistors with the GAA structure. In other words, the diode of Example 1 or Example 2 described below can be manufactured in substantially the same steps as those for field effect transistors with the GAA structure.

Further, the diode of Example 1 is provided with the control electrode section, and thus even in a case where, as a result of injection of electrons from the gate electrode into the stacked structure, a conduction band and a valence band are depressed in the stacked structure and the stacked structure includes an intrinsic semiconductor region (intrinsic region) or has an impurity concentration of $1 \times 10^{18}/cm^3$ or less, the diode has substantially the same potential as that of the first connection section and can pass a current as a diode.

Additionally, the diode including the GAA structure and proposed in NPL 1 described above is compared with the diode of Example 1 below. The width and height of the first structure 21 and the second structure 22 in the diode of Example 1 is designated as "a." The cross-sectional area of the stacked structure 20 including two first structures 21 and two second structures 22, that is, the cross-sectional area of the diode of Example 1 is $4a^2$. On the other hand, in the diode proposed in NPL 1, a cross-sectional region with a width "a" and a height "4a" is occupied by two structures. Consequently, the cross-sectional area of the diode proposed in NPL 1 in which a current can be passed is $2 \times \Pi \times (a/2)^2 = 1.57a^2$. Specifically, in a case where the diode of Example 1 and the diode proposed in NPL 1 have the same cross-sectional area, the diode of Example 1 can pass a current 2.5 times (=4/1.57) as large as the current that can be passed in NPL 1. In a case where the same current is passed through the diodes, the diode of Example 1 may have a cross-sectional area 1/2.5 times as small as the cross-sectional area of the diode proposed in NPL 1.

Modified Example 1 of Diode of Example 1

Figure 9A:
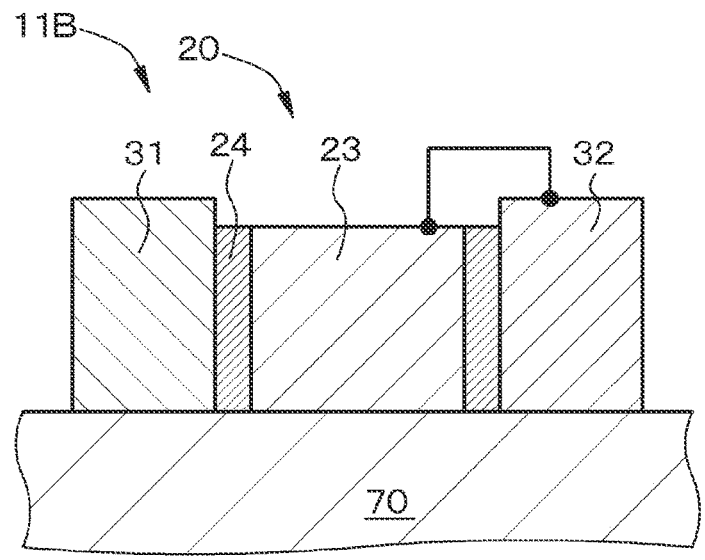
FIG. 9A and FIG. 9B are, respectively, a schematic, partially cross-sectional view of Modified Example 1 of the diode of Example 1, as in a case of being taken along arrows B-B in FIG. 2A, and a schematic, partially cross-sectional view of Modified Example 2 of the diode of Example 2, as in a case of being taken along arrows A-A in FIG. 2A.

FIG. 9A illustrates a schematic, partially cross-sectional view of Modified Example 1 (diode 11B) of the diode of Example 1, as in a case of being taken along arrows B-B in FIG. 2A. In Modified Example 1, the second connection section 32 and the control electrode section 23 are connected electrically.

Modified Example 2 of Diode of Example 1

Figure 9B:
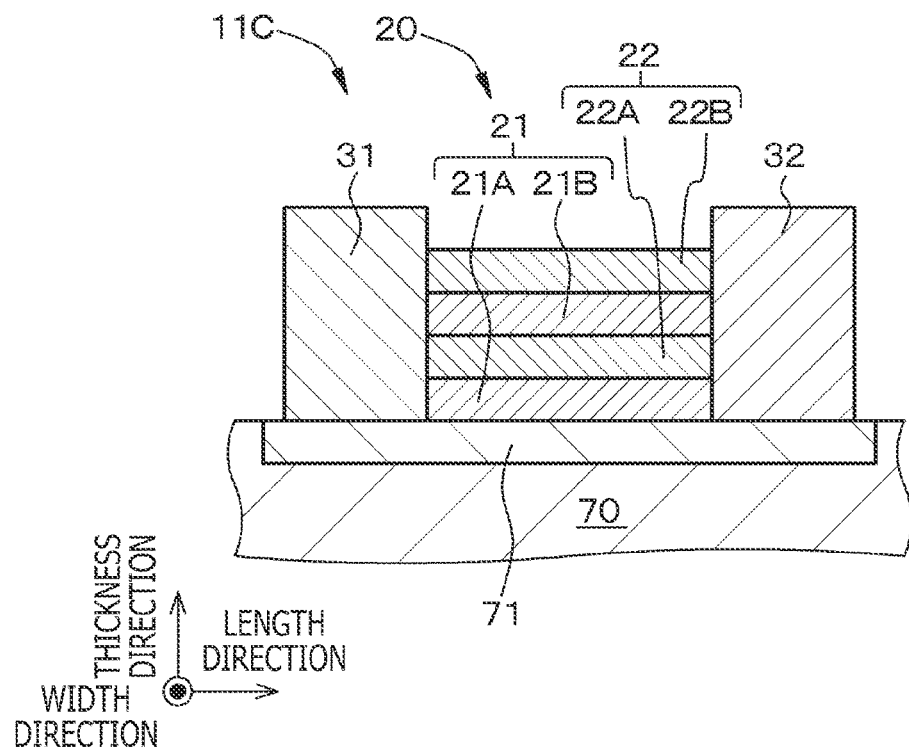

FIG. 9B illustrates a schematic, partially cross-sectional view of Modified Example 2 (diode 11C) of the diode of Example 1, as in a case of being taken along arrows A-A in FIG. 2A. In Modified Example 2, the region of the base 70 in which the diode 11C is provided has the second conductivity type (specifically, n⁺), the first connection section 31 and the control electrode section 23 are connected electrically, or the second connection section 32 and the control electrode section 23 are connected electrically. More specifically, the upper region of the base 70 in which the diode 11C is provided includes an n⁺ region 71, and the first connection section 31 and the n⁺ region 71 also constitute a diode. Then, such a structure increases the amount of the current path, enabling an increase in the amount of current that can be passed through the diode.

Modified Example 3 of Diode of Example 1

Figure 10A:
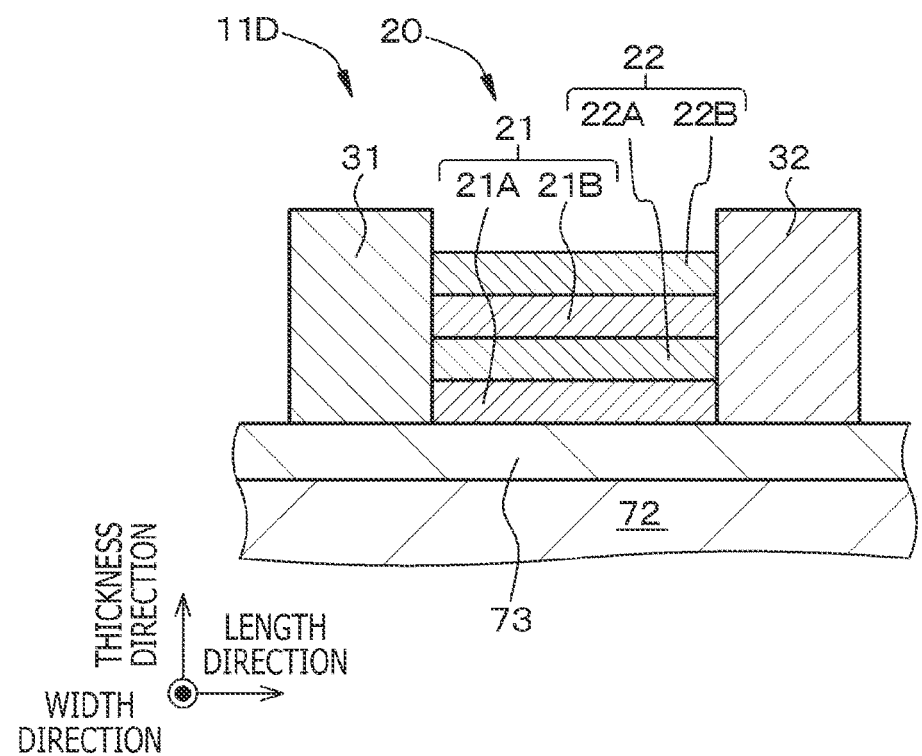
FIG. 10A and FIG. 10B are, respectively, a schematic, partially cross-sectional view of Modified Example 3 of the diode of Example 1, as in a case of being taken along arrows A-A in FIG. 2A, and a schematic, partially cross-sectional view of Modified Example 4 of the diode of Example 1, as in a case of being taken along arrows A-A in FIG. 2A.

FIG. 10A illustrates a schematic, partially cross-sectional view of Modified Example 3 (diode 11D) of the diode of Example 1, as in a case of being taken along arrows A-A in FIG. 2A. In Modified Example 3, the base includes an SOI substrate 72. The diode 11D is provided on a silicon layer 73 constituting the SOI substrate 72.

Modified Example 4 of Diode of Example 1

Figure 10B:
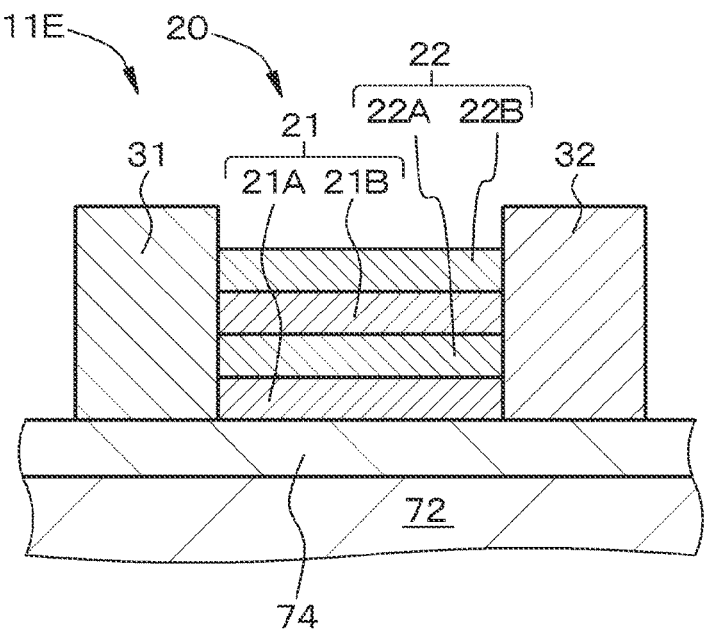

FIG. 10B illustrates a schematic, partially cross-sectional view of Modified Example 4 (diode 11E) of the diode of Example 1, as in a case of being taken along arrows A-A in FIG. 2A. In Modified Example 4 as well, a silicon layer 74 constituting a portion of the base 72 in which the diode 11E is provided has the second conductivity type (specifically, n⁺), the first connection section 31 and the control electrode section 23 are connected electrically, or the second connection section 32 and the control electrode section 23 are connected electrically. More specifically, the base includes the SOI substrate 72, and the diode 11E is provided on the n⁺ silicon layer 74 constituting the SOI substrate 72. The first connection section 31 and the n⁺ silicon layer 74 also constitute a diode. Then, such a structure increases the size of the current path, enabling an increase in the current that can be passed through the diode.

Modified Example 5 of Diode of Example 1

Figure 11A:
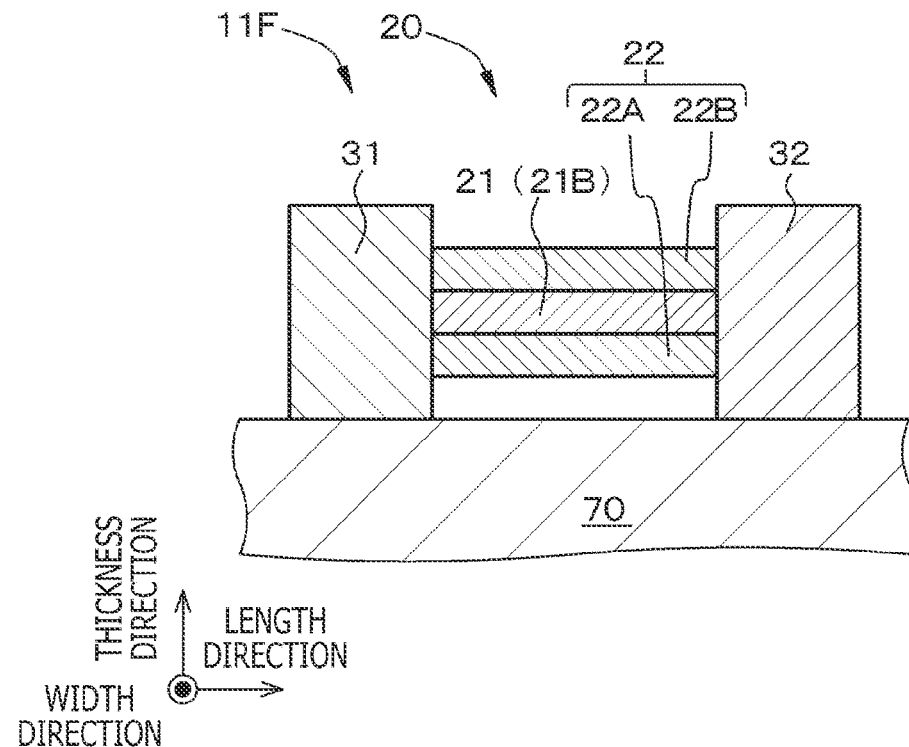
FIG. 11A and FIG. 11B are schematic, partially cross-sectional views of Modified Example 5 of the diode of Example 1, as in a case of being taken respectively along arrows A-A in FIG. 2A and along arrows B-B in FIG. 2A.
Figure 11B:
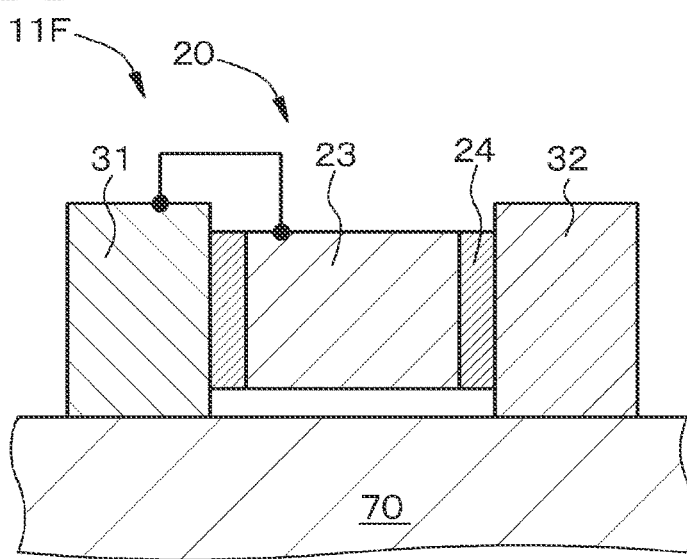
Figure 12A:
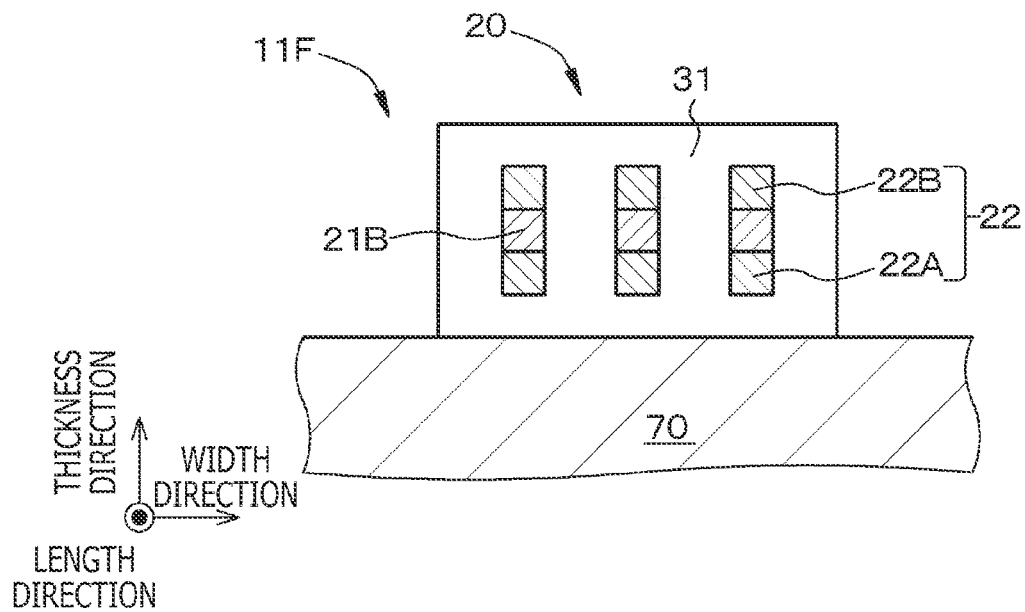
FIG. 12A and FIG. 12B are schematic, partially cross-sectional views of Modified Example 5 of the diode of Example 1, as in a case of being taken respectively along arrows C-C in FIG. 2A and along arrows D-D in FIG. 2B.
Figure 12B:
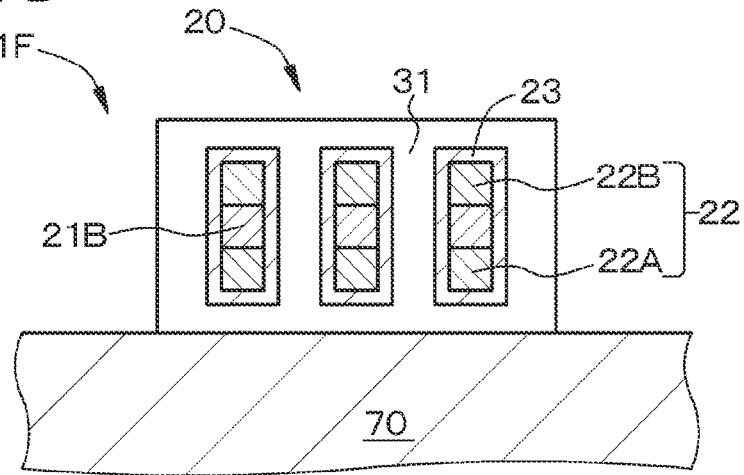

FIG. 11A illustrates a schematic, partially cross-sectional view of Modified Example 5 (diode 11F) of the diode of Example 1, as in a case of being taken along arrows A-A in FIG. 2A. FIG. 11B illustrates a schematic, partially cross-sectional view of Modified Example 5 (diode 11F), as in a case of being taken along arrows B-B in FIG. 2A. FIG. 12A and FIG. 12B illustrate schematic, partially cross-sectional views of Modified Example 5 (diode 11F), as in a case of being taken along arrows C-C in FIG. 2A and along arrows D-D in FIG. 2B, respectively. In the diode 11F, the control electrode section 23 is formed to reach the bottom surface of the stacked structure 20. The stacked structure 20 is provided above the base 70. In such a structure, the bottom surface of the stacked structure 20 is not in contact with the base 70, a bottom surface of the control electrode section 23 is in contact with the base 70, or as illustrated, the bottom surface of the control electrode section 23 is located above the base 70, and a gap is present between the bottom surface of the control electrode section 23 and a top surface of the base 70. The lowermost layer of the stacked structure 20 includes the second structure 22A, the number of first structures 21 is 1, and the number of second structures 22 is 2. However, no such limitation is intended. Such a structure can be obtained by forming a sacrifice layer instead of the first semiconductor layer 81 described above and removing the sacrifice layer from the stacked structure 20 in a step similar to [step-130B].

Example 2

Figure 13A:
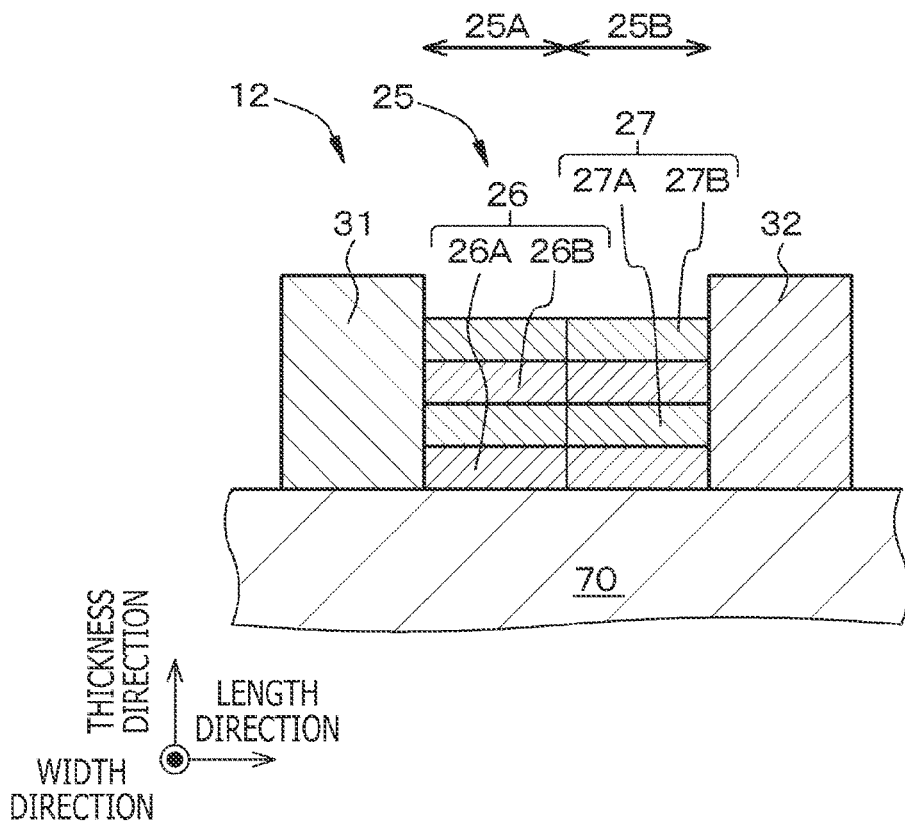
FIG. 13A and FIG. 13B are schematic, partially cross-sectional views of a diode of Example 2, as in a case of being taken respectively along arrows C-C in FIG. 2A and along arrows D-D in FIG. 2B.
Figure 13B:
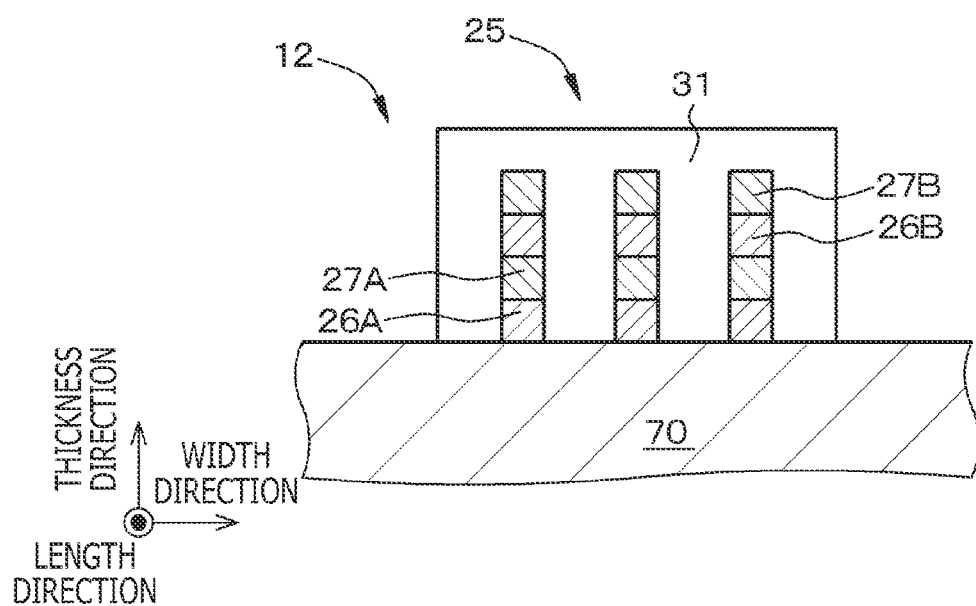

Example 2 relates to a diode according to a second mode of the present disclosure. FIG. 13A and FIG. 13B illustrate schematic, partially cross-sectional views of a diode of Example 2, as in a case of being taken along arrows C-C in FIG. 2A and along arrows D-D in FIG. 2B, respectively. Unlike the diode of Example 1, the diode of Example 2 is not provided with the control electrode section 23. A first portion 25A of the stacked structure 25 in contact with the first connection section 31 has the first conductivity type (specifically, for example, the p type). A second portion 25B of the stacked structure 25 in contact with the second connection section 32 has the second conductivity type (specifically, for example, the n type). The first portion 25A of the stacked structure 25 is in contact with the second portion 25B of the stacked structure 25. The first portion 25A can be provided by ion injection of p-type impurities, and the second portion 25B can be provided by ion injection of n-type impurities.

Except for the points described above, the configuration and structure of the diode of Example 2 are similar to the configuration and structure of the diode of Example 1, and thus detailed descriptions are omitted. Note that the configurations and structures of Modified Example 2, Modified Example 3, Modified Example 4, and Modified Example 5 of Example 1 can be applied to the diode of Example 2 as appropriate.

In the diode of Example 2, the value of a work function for the first structure 26 (26B) including Si—Ge differs by approximately 0.1 eV from the value of a work function for the second structure 27 (27A or 27B) including Si. A potential difference between the first connection section 31 and the second connection section 32 during operation as diodes (typically, 1 V or more) absorbs the difference in the value of the work function, enabling all of diode operations. The first structure 26 and the second structure 27 performs integral diode operations instead of performing separate diode operations, thus allowing the size of the current path to be doubled to increase the current that can be passed through the diode.

The present disclosure has been described on the basis of the preferred examples, but the configurations and structures of the diode and the field effect transistor, the materials constituting the diode and the field effect transistor, and the manufacturing methods for the diode and the field effect transistor described in the examples are illustrative and can be changed as appropriate. The order of steps of the manufacturing methods for the diode and the field effect transistor can be changed as desired and as appropriate. In the examples, the stacked structure and the channel section have been described solely on the basis of the nanowire structure but may be have a nanosheet structure. As the base, instead of the silicon semiconductor substrate and the SOI substrate, a GOI substrate and an SGOI substrate can be used. The element isolation region can be formed, for example, in [step-120A] or [step-130A].

Figure 14:
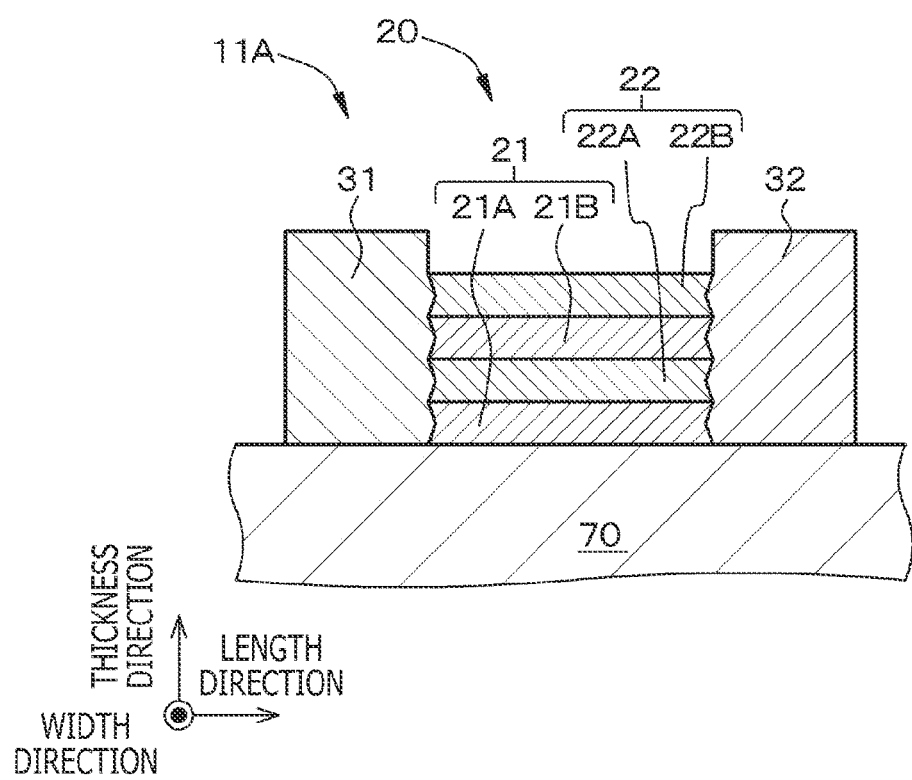
FIG. 14 is a schematic, partially cross-sectional view of Modified Example 5 of the diode of Example 1, as in a case of being taken along arrows C-C in FIG. 2A.

As illustrated in FIG. 14 corresponding to a schematic, partially cross-sectional view, as in a case of being taken along arrows A-A in FIG. 2A, the configuration may be such that the first connection section 31 in contact with the one end of the stacked structure 20 or 25 in the length direction includes a protruding portion with respect to the first structure 21 or 26 and the second structure 22 or 27 and such that the second connection section 32 in contact with the other end of the stacked structure 20 or 25 in the length direction includes a protruding portion with respect to the first structure 21 or 26 and the second structure 22 or 27. Specifically, assuming that a length of an upper surface of the first structure 21 or 26 or the second structure 22 or 27 is $L_T$, that a length of a lower surface of the first structure 21 or 26 or the second structure 22 or 27 is $L_B$, and that a length of a thickness-direction central portion of the first structure 21 or 26 or the second structure 22 or 27 is $L_C$, $L_T > L_C$ and $L_B > L_C$ are satisfied.

With the plane orientation of a main surface of the first structure 21 or 26 or the second structure 22 or 27 set to, for example, {110}, when obtained by etching, the first structure 21 or 26 or the second structure 22 or 27 can be formed in such a shape. Note that the shape of the first structure 21 or 26 or the second structure 22 or 27 obtained by etching is changed by the plane orientation of the first structure 21 or 26 or the second structure 22 or 27 and the extension direction of the first structure 21 or 26 or the second structure 22 or 27.

The Si—Ge layer can also be obtained by a process of forming an overlying Si—Ge layer on an underlying Si layer and executing oxidation treatment to change the overlying Si—Ge layer into $SiO_2$ while changing the underlying Si layer into an Si—Ge layer.

Note that the present disclosure can take the following configurations.

[A01] <<Diode: First Mode>>

A diode including:

a stacked structure;

a first connection section provided at one end of the stacked structure in a length direction;

a second connection section provided at the other end of the stacked structure in the length direction, the stacked structure including a first structure with a nanowire structure or a nanosheet structure and a second structure with the nanowire structure or the nanosheet structure including a material different from a material constituting the first structure, the first structure and the second structure being stacked alternately in a thickness direction, the first connection section having a first conductivity type, the second connection section having a second conductivity type different from the first conductivity type, the diode further including:

a control electrode section formed to extend at least from a top portion to a side surface of the stacked structure and spaced apart from the first connection section and the second connection section the first connection section and the control electrode section or the second connection section and the control electrode section being connected electrically.

[A02]

The diode according to [A01], in which the stacked structure is provided on a base.

[A03]

The diode according to [A01], in which the control electrode section is formed to reach a bottom surface of the stacked structure.

[A04]

The diode according to [A03], in which the stacked structure is provided above the base.

[A05]

The diode according to any one of [A02] to [A04], in which the base includes a silicon semiconductor substrate or an SOI substrate.

[A06]

The diode according to any one of [A02] to [A05], in which the first connection section and the second connection section are provided on the base.

[A07]

The diode according to any one of [A02] to [A06], in which a region of the base on which the diode is provided has the second conductivity type, and the first connection section and the control electrode section are connected electrically or the second connection section and the control electrode section are connected electrically.

[A08]

The diode according to any one of [A01] to [A07], in which the first conductivity type is a p type, and the second conductivity type is an n type.

[A09]

The diode according to any one of [A01] to [A08], in which the first structure includes silicon-germanium, and the second structure includes silicon.

[A10]

The diode according to any one of [A01] to [A09], in which the stacked structure includes an intrinsic semiconductor region.

[A11]

The diode according to any one of [A01] to [A09], in which the stacked structure has an impurity concentration of $1 \times 10^{18}/cm^3$ or less.

[A12]

The diode according to any one of [A01] to [A11], in which an insulating layer is formed on a side surface of the control electrode section facing the first connection section and formed on a side surface of the control electrode section facing the second connection section.

[A13]

The diode according to any one of [A01] to [A12], in which the control electrode section includes TiN, TaN, Al, TiAl, or W.

[B01] <<Diode: Second Mode>>

A diode including:

a stacked structure;

a first connection section provided at one end of the stacked structure in a length direction; and a second connection section provided at the other end of the stacked structure in the length direction, in which the stacked structure includes a first structure with a nanowire structure or a nanosheet structure and a second structure with the nanowire structure or the nanosheet structure including a material different from a material constituting the first structure, the first structure and the second structure being stacked alternately in a thickness direction, the first connection section has a first conductivity type, the second connection section has a second conductivity type different from the first conductivity type, a first portion of the stacked structure in contact with the first connection section has the first conductivity type, and a second portion of the stacked structure in contact with the second connection section has the second conductivity type.

[B02]

The diode according to [B01], in which the first portion of the stacked structure is in contact with the second portion of the stacked structure.

[C01]

The diode according to any one of [A01] to [B02], in which the first connection section in contact with the one end of the stacked structure in the length direction includes a protruding portion with respect to the first structure and the second structure, and the second connection section in contact with the other end of the stacked structure in the length direction includes a protruding portion with respect to the first structure and the second structure.

[C02]

The diode according to [C01], in which, assuming that a length of an upper surface of the first structure or the second structure is $L_T$, that a length of a lower surface of the first structure or the second structure is $L_B$, and that a length of a thickness-direction central portion of the first structure or the second structure is $L_C$, $L_T > L_C$ and $L_B > L_C$ are satisfied.

REFERENCE SIGNS LIST 11A, 11B, 11C, 11D, 11E, 11F, 12 . . . Diode, 20, 25 . . . Stacked structure, 21, 21A, 21B, 26, 26B . . . First structure, 22, 22A, 22B, 27, 27A, 27B . . . Second structure, 23 . . . Control electrode section, 24 . . . Insulating layer (sidewall), 25A . . . First portion of stacked structure, 25B . . . Second portion of stacked structure, 31 . . . First connection section, 32 . . . Second connection section, 41, 42 . . . Field effect transistor, 50A, 50B . . . Channel structure section, 51, 51A, 51B, 52, 52A, 52B . . . Channel section, 53 . . . Gate electrode, 54 . . . Gate sidewall, 55 . . . Gate insulating film, 61, 62 . . . Source/drain region, 70 . . . Base, 71 . . . n$^+$ layer in base, 72 . . . SOI substrate, 73 . . . Silicon layer in SOI substrate, 74 . . . n$^+$ silicon layer in SOI substrate, 81 . . . First semiconductor layer, 82 . . . Second semiconductor layer, 83 . . . Third semiconductor layer, 84 . . . Fourth semiconductor layer, 91, 92 . . . Etching resist

What is claimed is:

1. A diode, comprising:

a stacked structure, including:

a first structure, wherein the first structure has a nano wire structure or a nanosheet structure; and a second structure, wherein the second structure has a nano wire structure or a nanosheet structure, and wherein a material of the first structure is different than a material of the second structure;

a first connection section, wherein the first connection section is in contact with a first end of the first structure, wherein the first connection section is in contact with a first end of the second structure, and wherein the first connection section has a first conductivity type;

a second connection section, wherein the second connection section is in contact with a second end of the first structure, wherein the second connection section is in contact with a second end of the second structure, wherein the second connection section has a second conductivity type, and wherein the first connection section is spaced apart from the second connection section; and a control electrode, wherein the control electrode is spaced apart from the first connection section, wherein the control electrode is spaced apart from the second connection section, wherein the control electrode is in contact with at least a portion of a surface of the first structure, wherein the control electrode is in contact with at least a portion of a surface of the second structure, and wherein the control electrode is electrically connected to one of the first connection section or the second connection section.

2. The diode of claim 1, wherein the first conductivity type is one of an n-type or a p-type, and wherein the second conductivity type is the other one of an n-type or a p-type.

3. The diode of claim 1, further comprising:
an insulating layer, wherein the insulating layer is between a first surface of the control electrode and the first connection section, and wherein the insulating layer is between a second surface of the control electrode and the second connection section.

4. The diode of claim 1, wherein the control electrode completely surrounds a portion of the first structure, and wherein the control electrode completely surrounds a portion of second structure.

5. The diode of claim 1, further comprising:
a base, wherein the first structure is in contact with the base.

6. The diode of claim 5, wherein the control electrode partially surrounds a portion of the first structure, and wherein the control electrode completely surrounds a portion of the second structure.

7. The diode of claim 5, wherein the control electrode partially surrounds a portion of the first structure, and wherein the control electrode partially surrounds a portion of the second structure.

8. The diode of claim 7, wherein the first structure is in contact with the second structure.

9. The diode of claim 8, wherein the stacked structure includes at least one first structure stacked between two second structures.

10. The diode of claim 8, wherein the stacked structure includes at least two first structures and at least two second structures, and wherein the first structures are alternately stacked with the second structures.

11. The diode of claim 1, wherein the stacked structure includes a plurality of first structures and a plurality of second structures, wherein the first and second structures are divided into sets of structures, wherein each of the sets of structures includes at least one first structure and at least one second structure.

12. A transistor, comprising:
a stacked structure, including:
a first structure, wherein the first structure has a nano wire structure or a nanosheet structure; and
a second structure, wherein the second structure has a nano wire structure or a nanosheet structure, and wherein a material of the first structure is different than a material of the second structure;
a first connection section, wherein the first connection section is in contact with a first end of the first structure, wherein the first connection section is in contact with a first end of the second structure, and wherein the first connection section has a first conductivity type;
a second connection section, wherein the second connection section is in contact with a second end of the first structure, wherein the second connection section is in contact with a second end of the second structure, wherein the second connection section has a second conductivity type, and wherein the first connection section is spaced apart from the second connection section; and
a control electrode, wherein the control electrode is spaced apart from the first connection section, wherein the control electrode is spaced apart from the second connection section, wherein the control electrode is in contact with at least a portion of a surface of the first structure, wherein the control electrode is in contact with at least a portion of a surface of the second structure, and wherein the control electrode is electrically connected to one of the first connection section or the second connection section.

13. The transistor of claim 12, wherein the first conductivity type is one of an n-type or a p-type, and wherein the second conductivity type is the other one of an n-type or a p-type.

14. The transistor of claim 12, further comprising:
an insulating layer, wherein the insulating layer is between a first surface of the control electrode and the first connection section, and wherein the insulating layer is between a second surface of the control electrode and the second connection section.

15. The transistor of claim 12, wherein the control electrode completely surrounds a portion of the first structure, and wherein the control electrode completely surrounds a portion of second structure.

16. The transistor of claim 12, further comprising:
a base, wherein the first structure is in contact with the base.

17. The transistor of claim 16, wherein the control electrode partially surrounds a portion of the first structure, and wherein the control electrode completely surrounds a portion of the second structure.

18. The transistor of claim 16, wherein the control electrode partially surrounds a portion of the first structure, and wherein the control electrode partially surrounds a portion of the second structure.

19. The transistor of claim 18, wherein the first structure is in contact with the second structure.

20. The transistor of claim 19, wherein the stacked structure includes at least one first structure stacked between two second structures.

* * * * *